United States Patent [19]

Miyashita

[11] Patent Number: 5,726,591
[45] Date of Patent: Mar. 10, 1998

[54] MESFET LOGIC DEVICE WITH CLAMPED OUTPUT DRIVE CAPACITY AND LOW POWER

[75] Inventor: Takumi Miyashita, Kawasaki, Japan

[73] Assignee: Fujitsu Limited, Kanagawa, Japan

[21] Appl. No.: 605,715

[22] Filed: Feb. 22, 1996

Related U.S. Application Data

[63] Continuation of Ser. No. 482,953, Jun. 15, 1995, abandoned, which is a continuation of Ser. No. 263,730, Jun. 22, 1994, abandoned.

[30] Foreign Application Priority Data

Jun. 30, 1993 [JP] Japan ................. 5-160544

[51] Int. Cl.$^6$ ........................... H03K 19/0952
[52] U.S. Cl. ........................... 326/117; 326/30
[58] Field of Search ................ 326/30, 116, 117; 327/180

[56] References Cited

U.S. PATENT DOCUMENTS

| | | | |
|---|---|---|---|
| 4,716,311 | 12/1987 | Davenport et al. | |
| 4,810,969 | 3/1989 | Fulkerson | 307/448 |
| 4,935,647 | 6/1990 | Larkins | 307/450 |
| 5,021,686 | 6/1991 | Kawata et al. | 307/448 |
| 5,107,144 | 4/1992 | Hirayama | 307/448 |
| 5,182,473 | 1/1993 | Wikstrom . | |
| 5,343,091 | 8/1994 | Terada | 307/448 |

OTHER PUBLICATIONS

Patent Abstracts of Japan—vol. 14, No. 411 (E–0973) Sep. 5, 1990 & JP-A-02 155 309 (Oki Electric Co Ltd.) Jun. 14, 1990. Abstract.

Patent Abstracts of Japan—vol. 14, No. 502 (E–0997) Nov. 2, 1990 & JP-A-02 209 011 (Agency of Ind Science and Technol.) Aug. 20, 1990. Abstract.

Patent Abstracts of Japan—vol. 14, No. 142 (E–904) Mar. 16, 1990 & JP-A-02 005 618 (Fujitsu Ltd.) Jun. 23, 1988. Abstract.

Primary Examiner—Edward P. Westin
Assistant Examiner—Benjamin D. Driscoll
Attorney, Agent, or Firm—Armstrong, Westerman, Hattori, McLeland & Naughton

[57] ABSTRACT

A logic gate circuit includes a logic gate stage to which an input signal is supplied, for outputting a signal depending on a state of the input signal, an output driver stage having an enhancement-type transistor for pull-up and a pull-down circuit, the enhancement-type transistor having a drain connected to a power supply line, a gate to which the signal output from the logic gate stage is supplied and a source connected to the pull-down circuit, the pull-down circuit being connected to the ground line and controlled by the input signal, and a clamping circuit for clamping a gate voltage of the enhancement-type transistor of the output driver stage at a constant voltage so that a node at which the source of the enhancement-type transistor and the pull-down circuit are connected has a high level, the node being an output terminal of the logic gate circuit. A logic gate circuit may have at least an output driver stage including an enhancement-type transistor for pull-up and an enhancement-type transistor for pull-down, and a clamping circuit for clamping the gate voltage of the enhancement-type transistor for the pull-up.

9 Claims, 29 Drawing Sheets

97 LOGIC GATE CIRCUIT

LOGIC GATE CIRCUIT

253
LOGIC GATE CIRCUIT

MESFET LOGIC DEVICE WITH CLAMPED OUTPUT DRIVE CAPACITY AND LOW POWER

This is a continuation of application Ser. No. 08/482,953 filed Jun. 15, 1995 now abandoned; which is a continuation of application Ser. No. 08/263,730 filed Jun. 22, 1994, now abandoned.

BACKGROUND OF THE INVENTION (1) Field of the Invention

The present invention generally relates to a logic gate circuit formed of semiconductor transistors, for example, compound semiconductor transistors such as MES FETs (Metal Semiconductor Field Effect Transistors) and HEMTs (High Electron Mobility Transistors).

For instance, in a case where a GaAs integrated circuit is formed, an output stage in a circuit having a large fan out, such as a clock circuit and a bus driving circuit, and a logic gate used as an off chip buffer for driving a circuit outside a chip require a superior load drivability. As a result, a post-stage in a logic gate portion is provided with an output driver.

(2) Description of the Related Art

Conventionally, a circuit as shown in FIG. 1 has been known as this above type of logic gate circuit.

Referring to FIG. 1, the logic gate circuit has an inverter 1, a push-pull circuit 5 and a clamping circuit 9. The inverter 1 is formed as a logic gate stage, and an input signal IN is supplied to the inverter 1. The input signal IN may have a high level (H-level) and a low level (L-level), the H-level being, for example, 0.7 volts and the L-level being, for example, 0 volts.

The inverter 1 has an enhancement-type MES FET (Metal Semiconductor Mobility Transistor) 2 used as a driver and a depletion-type MES FET 3 which is used as a load. A power supply line 4 (VDD) is connected to the inverter 1. The power supply line 4 supplies a voltage, for example, of 2 volts.

The push-pull circuit 5 is formed as an output driver state. The push-pull circuit 5 has a depletion-type MES FET 6 used for the pull-up and an enhancement-type MES FET 7 used for the pull-down. An output signal OUT is output from an output node 8 at which the depletion-type MES FET 6 and the enhancement-type MES FET 7 are connected.

The clamping circuit 9 clamps the gate voltage of the depletion-type MES FET 6 at a constant voltage to cause a level at the output node 8 to be stable at 0.7 volts when the output signal OUT has the H-level. The clamping circuit 9 has a Schottky diode 10 and an enhancement-type MES FET 11.

In this logic gate circuit, when the input signal IN has the H-level equal to 0.7 volts, the output signal OUT has the L-level equal to 0 volts. On the other hand, when the input signal IN has the L-level equal to 0 volts, the output signal OUT has the H-level equal to 0.7 volts.

If the clamping circuit 9 is not provided in this logic gate circuit, the level of the output signal OUT exceeds 0.7 volts in response to the input signal IN having the L-level equal to 0 volts. As a result, a large amount of current flows from the power supply line 4 (VDD) to the next stage circuit connected to this logic gate circuit via the depletion-type MES FET 6.

To prevent the above, the clamping circuit 9 is provided in this logic gate circuit. If the level at the output node 8 exceeds 0.7 volts, the enhancement-type MES FET 11 is turned on. As a result, the gate voltage of the depletion-type MES FET 6 is decreased and clamped by the Schottky diode 10 so that the level at the output node 8 is made to be stable at 0.7 volts.

In this logic gate circuit, since the push-pull circuit 5 is provided in a post-stage for the inverter 1 formed as the logic gate stage, a large load drivability can be obtained.

However, although the clamping circuit 9 is provided in the logic gate circuit, when the level of the input signal IN is switched to the L-level equal to 0 volts, the level of the output node 8 temporarily exceeds 0.7 volts and is then decreased to 0.7 volts. Thus, when the level of the output signal OUT is inverted from L-level to the H-level, a current independent of the logical inversion operation temporarily flows from the power supply line 4 (VDD) to a transistor in the next stage circuit via the depletion-type MES FET 6.

In addition, in this logic gate circuit, the depletion-type MES FET 6 for the pull-up in the push-pull circuit 5 has a low threshold level and is always in an on state. Thus, to maintain the level of the output signal OUT at the L-level, a W/L ratio of the enhancement-type MES FET 7 for the pull-down must be large, where W is a width of a channel and L is a length of the channel. As a result, an input capacity is large, so that a high speed operation is prevented.

SUMMARY OF THE INVENTION

Accordingly, a general object of the present invention is to provide a novel and useful logic gate circuit in which the disadvantages of the aforementioned prior art are eliminated.

A more specific object of the present invention is to provide a logic gate circuit having a large load drivability, a low dissipation power and a low input capacity.

The above objects of the present invention are achieved by a logic gate circuit comprising: a logic gate stage to which one or a plurality of input signals are supplied, for outputting a signal depending on a state of the one or the plurality of input signals; an output driver stage having a pull-up circuit formed of an enhancement-type transistor and a pull-down circuit, the enhancement-type transistor having a drain connected to a first line having a first voltage, a gate to which the signal output from the logic gate stage is supplied and a source connected to the pull-down circuit, the pull-down circuit being connected to a second line having a second voltage less than the first voltage and controlled by the one or the plurality of input signals; and a clamping circuit for clamping a gate voltage of the enhancement-type transistor of the output driver stage at a limited voltage so that a node at which the source of the enhancement-type transistor and the pull-down circuit are connected has an appropriately high level, the node being an output terminal of the logic gate circuit.

According to the present invention, since the logic gate circuit has the output driver stage including the enhancement-type transistor, a large load drivability can be obtained. In addition, since the logic gate circuit has the clamping circuit connected to the gate of the enhancement-type transistor to clamp the output signal at an appropriate level when the output signal has the H-level, a low dissipation power can be obtained. Further, since a transistor for the pull-up of the output driver stage is formed of the enhancement-type transistor which is not always in the ON state, in a case where the pull-down circuit is formed of an enhancement-type transistor, the W/L ratio can be small. As a result, a low input capacitance can be obtained.

Another object of the present invention is to provide a logic gate circuit having at least a large load driving performance and a low dissipation power can be obtained.

The above objects of the present invention are achieved by a logic gate circuit comprising: an output driver stage having a first enhancement-type transistor for pull-up and a second enhancement-type transistor for pull-down, the first enhancement-type transistor having a drain connected to a first line having a first voltage and a gate to which a pull-up control signal is supplied, the second enhancement-type transistor having a drain connected to a source of the first enhancement-type transistor, a source connected to a second line having a second voltage less than the first voltage and a gate to which a pull-down control signal is supplied, an output signal of the output driver stage being obtained from a node at which the source of the first enhancement-type transistor and the second enhancement-type transistor are connected; and a clamping circuit for clamping the node at a predetermined level when the output signal has a high-level.

According to the present invention, since the logic circuit has the output driver stage including the first enhancement-type transistor, a large load drivability can be obtained. In addition, since the logical circuit has the clamping circuit operating the first enhancement-type transistor to clamp the output signal at an appropriate level when the output signal has the H-level, a low dissipation power can be obtained.

Additional objects, features and advantages of the present invention will become apparent from the following detailed description when read in conjunction with the accompanying drawings.

DESCRIPTION OF THE PREFERRED EMBODIMENT

First, a description will be given, with reference to FIG. 2, of the principle of a logic gate circuit according to the present invention.

Figure 1:
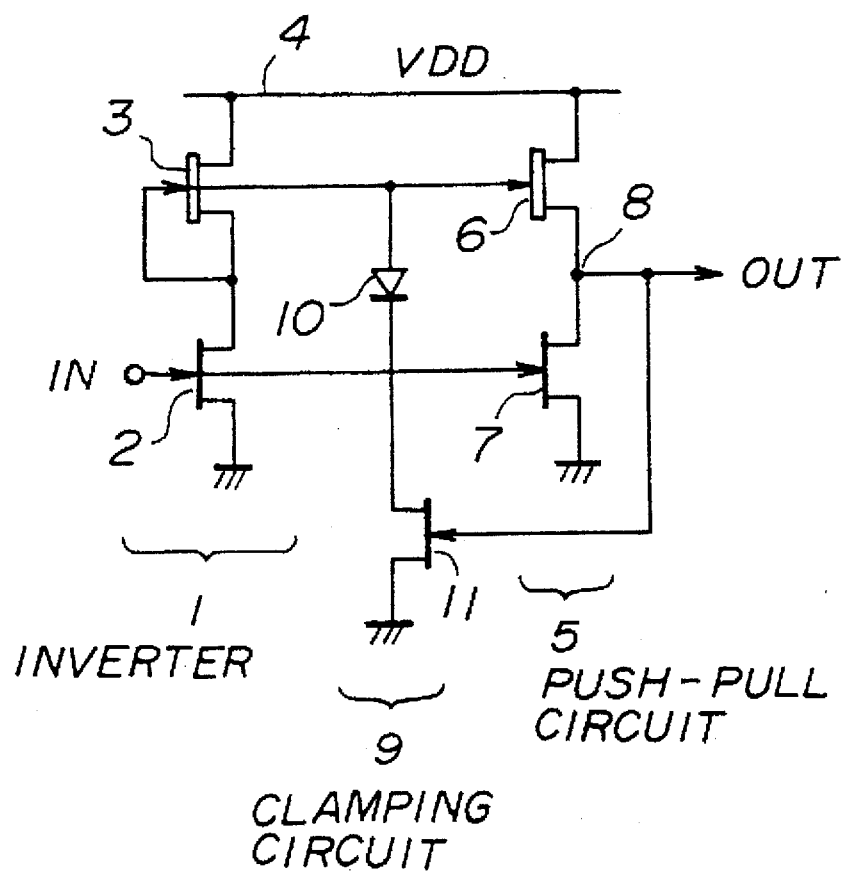
FIG. 1 is a circuit diagram illustrating an example of a conventional logic gate circuit.
Figure 2:
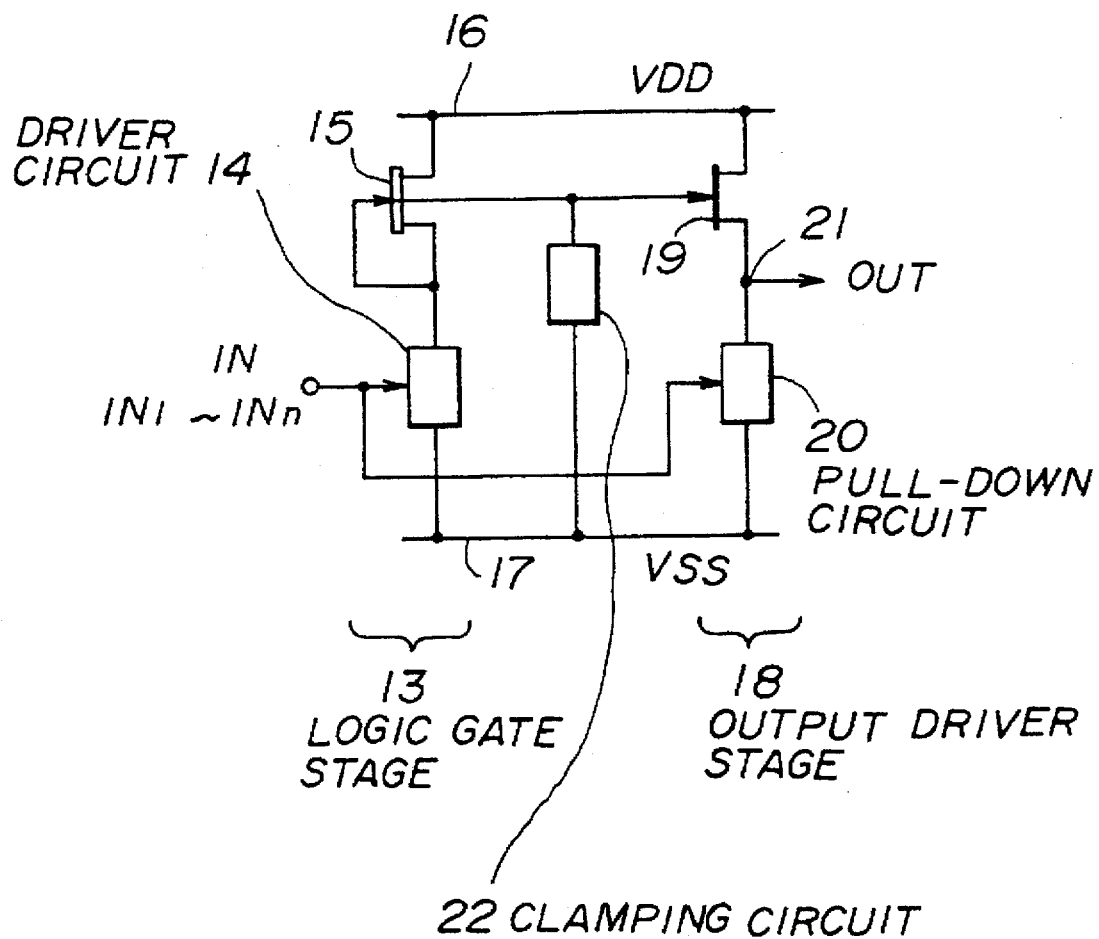
FIG. 2 is a circuit diagram illustrating the principle of the present invention.

Referring to FIG. 2, a logic gate circuit comprises a logic gate stage 13, an output driver stage 18 and a clamping circuit 22. The logic gate stage 13 has a driving circuit 14 and a depletion-type compound semiconductor transistor 15 used as a load. The driving circuit 14 has one or a plurality of enhancement-type compound semiconductor transistors to which one or a plurality of input signals IN or IN1–INn to be logically processed are supplied. A power supply line 16 (VDD) having a high voltage VDD and a power supply line 17 (VSS) having a low voltage VSS are connected to the logic gate stage 13 and the output driver stage 18.

The output driver stage 18 has an enhancement-type compound semiconductor transistor 19 for the pull-up and a pull-down circuit 20. The pull-down circuit 20 has one or a plurality of enhancement-type compound semiconductor transistors to which the one or the plurality of input signals IN or IN1–INn to be logically processed are supplied. A node 21 at which the enhancement-type compound semiconductor transistor 19 and the pull-down circuit 20 are connected is formed as an output terminal.

The clamping circuit 22 clamps the gate voltage of the enhancement-type compound transistor 19 for the pull-up at a constant voltage so that the level at the node 21 is maintained at a proper level.

The driving circuit 14 may also comprise, for example, an enhancement-type compound semiconductor transistor in which the drain is connected to the source of the depletion-type compound semiconductor transistor 15, the source is connected to the power supply line 17 (VSS) and the gate may be provided with an input signal IN. The pull-down circuit 20 may comprise, for example, an enhancement-type compound semiconductor transistor in which the drain is connected to the source of the enhancement-type compound semiconductor 19, the source is connected to the power supply line 17 (VSS) and the gate may be provided with the input signal IN. In this case, the logic gate circuit can be formed as an inverter circuit.

The driving circuit 14 may comprise, for example, a plurality of enhancement-type compound semiconductor transistors in which the drains are connected to the source of the depletion-type compound semiconductor transistor 15, the sources are connected to the power supply line 17 (VSS) and the gates may be provided with input signals IN1–INn. The pull-down circuit 20 may comprise, for example, a plurality of enhancement compound semiconductor transistors in which the drains are connected to the source of the enhancement-type compound semiconductor transistor 19, the sources are connected to the power supply line 17 (VSS) and the gates may be supplied with the input signals IN1–INn. In this case, the logic gate circuit can be formed as a NOR gate circuit to which the input signals IN1–INn are supplied.

The driving circuit 14 may also comprise, for example, a plurality of enhancement-type compound semiconductor transistors which are serially connected to the source of the depletion-type compound semiconductor transistor 15 and the power supply line 17 (VSS) so as to be located between them and may be provided with input signals IN1–INn. The pull-down circuit 20 may comprise, for example, a plurality of enhancement-type compound semiconductor transistors which are serially connected to the source of the enhancement-type compound semiconductor transistor 19 and the power supply line 17 (VSS) so as to be located between them and may be provided with the input signals IN1–INn. In this case, the logic gate circuit can be formed as a NAND gate circuit.

In the logic gate circuit shown in FIG. 2, since the driver output stage having the enhancement-type compound semiconductor transistor for the pull-up and the pull-down circuit 20 is provided in the post-stage for the logic gate stage 13, a large load drivability can be obtained.

In addition, an end of the clamping circuit 22 is connected to the gate of the enhancement-type compound semiconductor transistor 19 and another end thereof is connected to the power supply line 17 (VSS). As a result, the clamping circuit 22 clamps the gate voltage of the enhancement-type compound semiconductor transistor 19 at a constant voltage so that the node 21 is maintained at a proper level when the output signal has the H-level. Thus, when the level of the output signal OUT is switched from the L-level to the H-level, a current which flows from the power supply line 16 (VDD) to an input transistor in the next stage circuit via the enhancement-type compound semiconductor transistor 19 can be limited to the minimum value. As a result, the low dissipation power can be obtained.

Furthermore, the transistor for the pull-up in the output driver stage 18 is formed of the enhancement-type compound semiconductor transistor 19 which is not always in the on state. Thus, the W/L ratio of one or a plurality of enhancement-type compound semiconductor transistors of the pull-down circuit 20 can be small, so that the low input capacity can be obtained.

A description will now be given of a first embodiment of the present invention.

Figure 3:
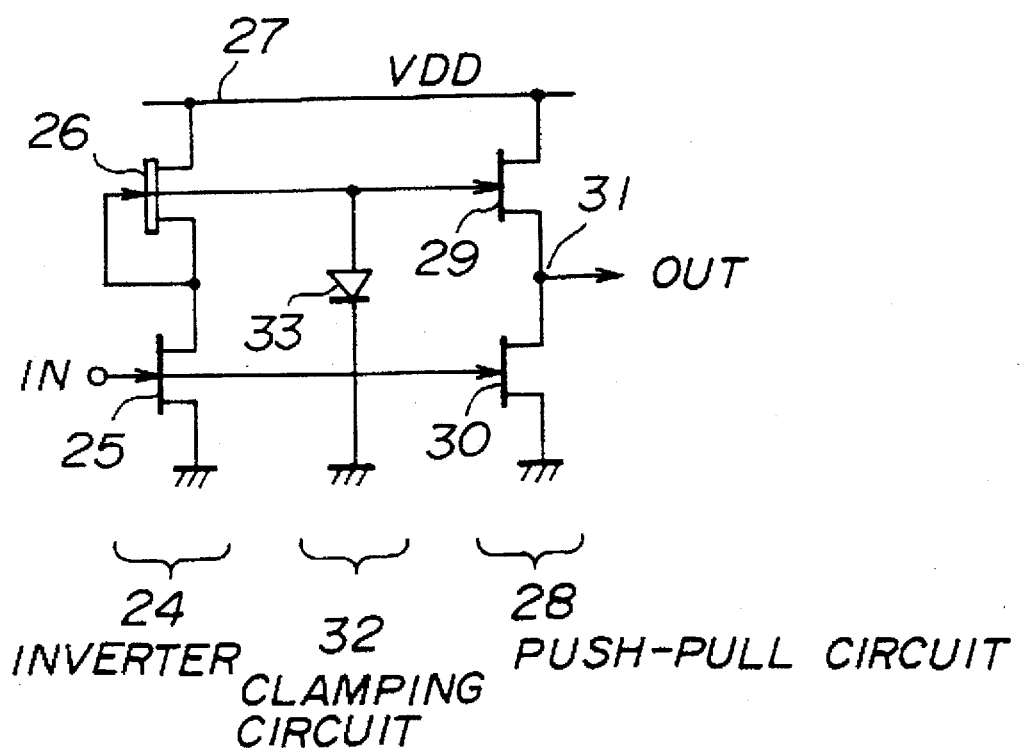
FIG. 3 is a circuit diagram illustrating a logic gate circuit according to a first embodiment of the present invention.

If the present invention is applied to an inverter circuit with a driver circuit, the inverter circuit is formed, for example, as shown in FIG. 3.

Referring to FIG. 3, an inverter 24 is formed as a logic gate stage, and an input signal IN is supplied to the inverter 24. The input signal may have the H-level which is equal, for example, to 0.7 volts and the L-level which is equal, for example, to 0 volts. The inverter 24 comprises an enhancement-type MES FET 25 used as a driver and a depletion-type MES FET 26 used as a load. A power supply line 27 having, for example, 2 volts (VDD) is connected to the inverter 24.

A push-pull circuit 28 is formed as the output driver stage. The push-pull circuit 28 comprises an enhancement-type MES FET 29 for the pull-up and an enhancement-type MES FET 30 for the pull-down. A node 31 at which the enhancement-type MES FETs 29 and 30 are connected is formed as an output terminal.

A clamping circuit 32 clamps the gate voltage of the enhancement-type MES FET 29 at a predetermined voltage when the output signal OUT has the H-level. The clamping circuit 32 is formed of a Schottky diode 33.

In the first embodiment, when the input signal IN has the H-level, the enhancement-type MES FET 25 is in the ON state, the drain of the enhancement-type MES FET 25 has the L-level, the enhancement-type MES FET 29 is in the OFF state and the enhancement-type MES FET 30 is in the ON state. As a result, the node 31 (the output signal OUT) is at the L-level.

On the other hand, when the input signal IN has the L-level, the enhancement-type MES FET 20 is in the OFF state, the drain of the enhancement-type MES FET 25 has the H-level, the enhancement-type MES FET 29 is in the ON state and the enhancement-type MES FET 30 is in the OFF state. As a result, the node 31 (the output signal OUT) is at the H-level.

Also, according to the first embodiment, since the push-pull circuit 28 formed as the output driver stage is provided in the post-stage for the inverter 24 formed as the logic gate stage, a large load drivability can be obtained. In addition, the clamping circuit 32 is formed of the Schottky diode 33, the anode thereof being connected to the gate of the enhancement-type MES FET 29 and the cathode thereof being connected to the ground line (corresponding to the power supply line 17 (VSS) shown in FIG. 2). Thus, the gate voltage of the enhancement-type MES FET 29 is clamped at a voltage equal to a forward voltage $V_{DF}$. As a result, the level of the node 31 does not exceed a voltage ($V_{DF}-V_{TH29}$) where $V_{TH29}$ is a threshold voltage of the enhancement-type MES FET 29.

If the forward voltage $V_{DF}$ is equal to 0.7 volts ($V_{DF}=0.7[v]$) and the threshold voltage $V_{TH29}$ of the enhancement-type MES FET 29 is in a range from 0.1 volts to 0.2 volts ($V_{TH29}=0.1-0.2\,[v]$), the voltage of the node 31 falls within a range of 0.5–0.6 volts. As a result, in this case, if a threshold voltage of the next stage circuit connected with this inverter circuit falls within a range of 0.3–0.5 volts, the input transistor of the next stage circuit can be turned on. Furthermore, a current independent of the logical operation can be prevented from flowing from the power supply line 27 (VDD) to the input transistor of the next stage circuit via the enhancement-type MES FET 29. Thus, the low dissipation power can be obtained.

In addition, in the first embodiment, the transistor for the pull-up in the push-pull circuit 28 is formed of the enhancement-type MES FET 29 which is not always in the ON state. That is, when the output signal OUT should have the H-level, the enhancement-type MES FET 29 is in the ON state, and when the output signal OUT should have the L-level, the enhancement-type MES FET 29 is in the OFF state. Thus, the W/L ratio of the enhancement-type MES FET 30 for the pull-down can be small so that the input capacity can be small.

As has been described above, according to the first embodiment, the inverter with an output driver circuit can be provided with a large load drivability, a low dissipation power and a low input capacity can be obtained.

A description will now be given, with reference to FIG. 4, of a second embodiment in which the present invention is applied to an inverter with an output driver circuit. In the second embodiment, the structure of a clamping circuit 34 differs from that of the clamping circuit 32 in the first embodiment, while other parts of the second embodiment are the same as those in the first embodiment.

That is, the clamping circuit 34 has a Schottky diode 35 and an enhancement-type MES FET 36 connected to the Schottky diode 35.

In the second embodiment, when the input signal IN has the H-level, the MES FET 25 is in the ON state, the drain of the MES FET 25 has the L-level, the enhancement-type MES FET 29 is in the OFF state and the MES FET 30 is in the ON state. As a result, the node 31 (the output signal OUT) has the L-level.

On the other hand, when the input signal IN has the L-level, the MES FET 25 is in the OFF state, the enhancement-type MES FET 29 is in the ON state and the MES FET 30 is in the OFF state, the node 31 (the output signal OUT) has the H-level.

Also, according to the second embodiment, since the push-pull circuit 28 formed as the output driver stage is provided in the post-stage for the inverter 24 formed as the logic gate stage, a large load drivability can be obtained.

In addition, in the second embodiment, the clamping circuit 34 has the Schottky diode 35 and the MES FET 36, the anode of the Schottky diode 35 being connected to the gate of the enhancement-type MES FET 29. The drain of the MES FET 36 is connected to the cathode of the Schottky diode 35, the gate and drain of the MES FET 36 are connected to each other and the source of the MES FET 36 is connected to the ground line. As a result, when the output signal has the H-level, the gate voltage of the enhancement-type MES FET 29 is clamped to the voltage of ($V_{DF}$+$V_{TH29}$), where $V_{DF}$ is the forward voltage of the Schottky diode 35 and $V_{TH29}$ is the threshold voltage of the enhancement-type MES FET 29. Thus, if the threshold voltage $V_{TH36}$ of the MES FET 36 is equal to the threshold voltage $V_{TH29}$ of the enhancement-type MES FET 29, the voltage at the node 31 does not exceed a voltage of ($V_{DF}$+$V_{TH36}$−$V_{TH29}$=$V_{DF}$). That is, the voltage at the node 31 does not exceed the forward voltage $V_{DF}$ of the Schottky diode 35.

For example, if the forward voltage $V_{DF}$ of the Schottky diode 35 is equal to 0.7 volts ($V_{DF}$=0.7) and the threshold voltage $V_{TH29}$ of the enhancement-type MES FET 29 falls within a range of 0.1–0.2 volts ($V_{TH29}$=0.1–0.2), when the output signal OUT has the H-level, the voltage of the node 31 is equal to 0.7 volts. In this case, if the threshold voltage of the next stage circuit falls within a range of 0.3–0.5 volts, the input transistor in the next stage circuit can be turned on. Further, when the level of the node 31 is switched from the L-level to the H-level, a current independent of the logical operation is prevented from flowing from the power supply line 27 (VDD) to the input transistor in the next stage circuit via the enhancement-type MES FET 29. Thus, the lower dissipation power can be obtained.

Also, in the second embodiment, the transistor for the pull-up in the push-pull circuit 28 is formed of the enhancement MES FET 29 which is not always in the ON state. That is, when the output signal OUT should have the H-level, the enhancement-type MES FET 29 is in the ON state, and when the output signal should have the L-level, the enhancement-type MES FET 29 is in the OFF state. Thus, according to the second embodiment, the W/L ratio of the MES FET 30 for the pull-down can be small so that the input capacity can be small.

As has been described above, according to the second embodiment of the present invention, the inverter with the output driver circuit can be provided with a large load drivability, a low dissipation power and a low input capacity. In addition, since the level at the node 31 when the output signal OUT has the H-level can be higher than the level at the node 31 in the first embodiment, the processing speed of the circuit can be higher than that in the first embodiment.

Figure 5:
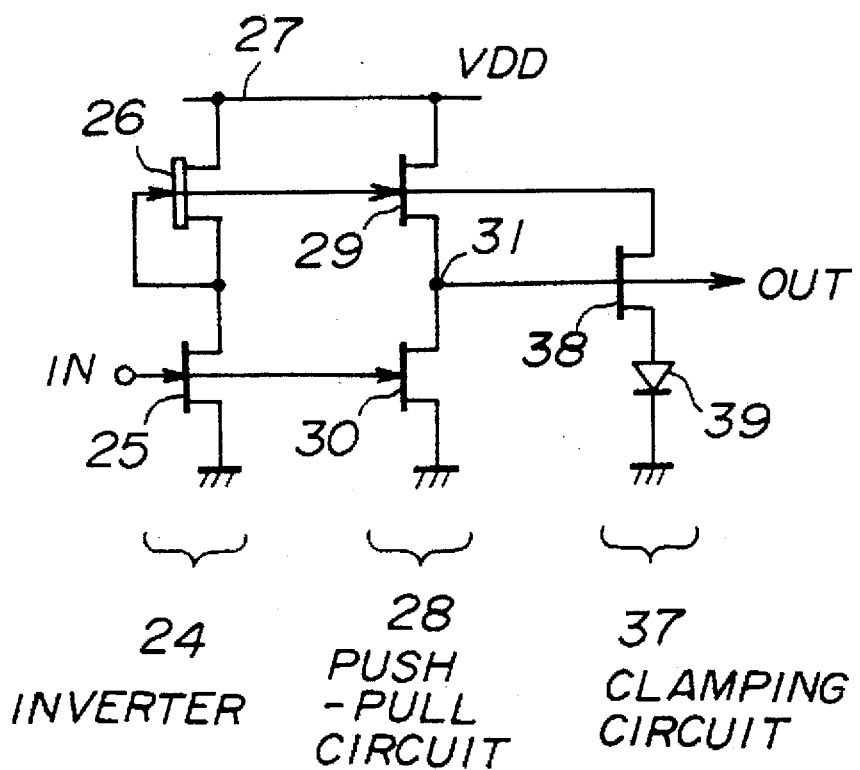
FIG. 5 is a circuit diagram illustrating a logic gate circuit according to a third embodiment of the present invention.

A description will now be given, with reference to FIG. 5, of a third embodiment in which the present invention is applied to an inverter with an output driver circuit. In the third embodiment, the structure of a clamping circuit 37 differs from that of the clamping circuit 32 in the first embodiment, while other parts of the third embodiment are the same as those in the first embodiment.

The clamping circuit 37 has an enhancement-type MES FET 38 and the Schottky diode 39. The enhancement-type MES FET 38 is controlled in accordance with the level at the node 31 so as to be in the ON state or in the OFF state and have a threshold level of approximately 0 volts.

In the third embodiment, when the input signal IN has the H-level, the MES FET 25 is in the ON state, the drain of the MES FET 25 has the L-level, the enhancement-type MES FET 29 is in the OFF state and the MES FET 30 is in the ON state. As a result, the node 31 (the output signal OUT) has the L-level.

On the other hand, when the input signal IN has the L-level, the MES FET 25 is in the OFF state, the drain of the MES FET 25 has the H-level, the enhancement-type MES FET 29 is in the ON state and the MES FET 30 is in the OFF state. AS a result, the node 31 (the output signal OUT) has the H-level.

Also in the third embodiment, the push-pull circuit 28 formed as the output driver stage is provided in the post-stage for the inverter 24 formed as the logic gate stage. Thus, a large load drivability can be obtained.

In addition, in the third embodiment, the MES FET 38 of the clamping circuit 37 has the drain connected to the gate of the enhancement-type MES FET 29 and the gate connected to the node 31, and has the threshold level of approximately 0 volts. The Schottky diode 39 of the clamping circuit 37 has the anode connected to the source of the MES FET 38 and the cathode connected to the ground line. As a result, when the level of the node 31 is switched from the L-level to the H-level, the MES FET 38 is in the OFF state until the level of the node 31 reaches a voltage equal to the forward voltage $V_{DF}$ of the Schottky diode 39. In this case, when the level of the node reaches the voltage equal to the forward voltage $V_{DF}$ of the Schottky diode 39, the MES FET 38 is turned on. As a result, the voltage at the node 31 is clamped to the forward voltage $V_{DF}$ of the Schottky diode 39.

If the forward voltage $V_{DF}$ of the Schottky diode 39 is equal to 0.7 volts ($V_{DF}$=0.7), the level of the node 31 is equal to the 0.7 volts when the output signal OUT has the H-level. In this case, if the threshold voltage in the next stage circuit falls within a range of 0.3–0.5 volts, the input transistor in the next stage circuit can be turned on. In addition, when the level of the node 31 is switched from the L-level to the H-level, a current independent of the logical operation is prevented from flowing from the power supply line 27 (VDD) to the input transistor in the next stage circuit via the enhancement-type MES FET 29. Thus, a low dissipation power can be obtained.

Also in the third embodiment, a transistor for the pull-up in the push-pull circuit 28 is formed of the enhancement-type MES FET 29 which is not always in the ON state. That is, when the output signal OUT should have the H-level, the enhancement-type MES FET 29 is in the ON state, and when the output signal OUT should have the L-level, the enhancement-type MES FET 29 is in the OFF state. Thus, the W/L ratio of the MES FET 30 for the pull-down can be small So that the input capacity can be small.

As has been described above, according to the third embodiment, in the inverter with the output driver circuit, the large load drivability can be obtained and the dissipation power and the input capacity can be decreased. In addition, when the output signal OUT has the H-level, the level at the node 31 is higher than that in the first embodiment. As a result, the processing speed in the circuit can be higher than that in the first embodiment.

A description will now be given, with reference to FIG. 6, to a fourth embodiment in which the present invention is applied to a 2-input NOR gate with an output driver circuit.

Figure 6:
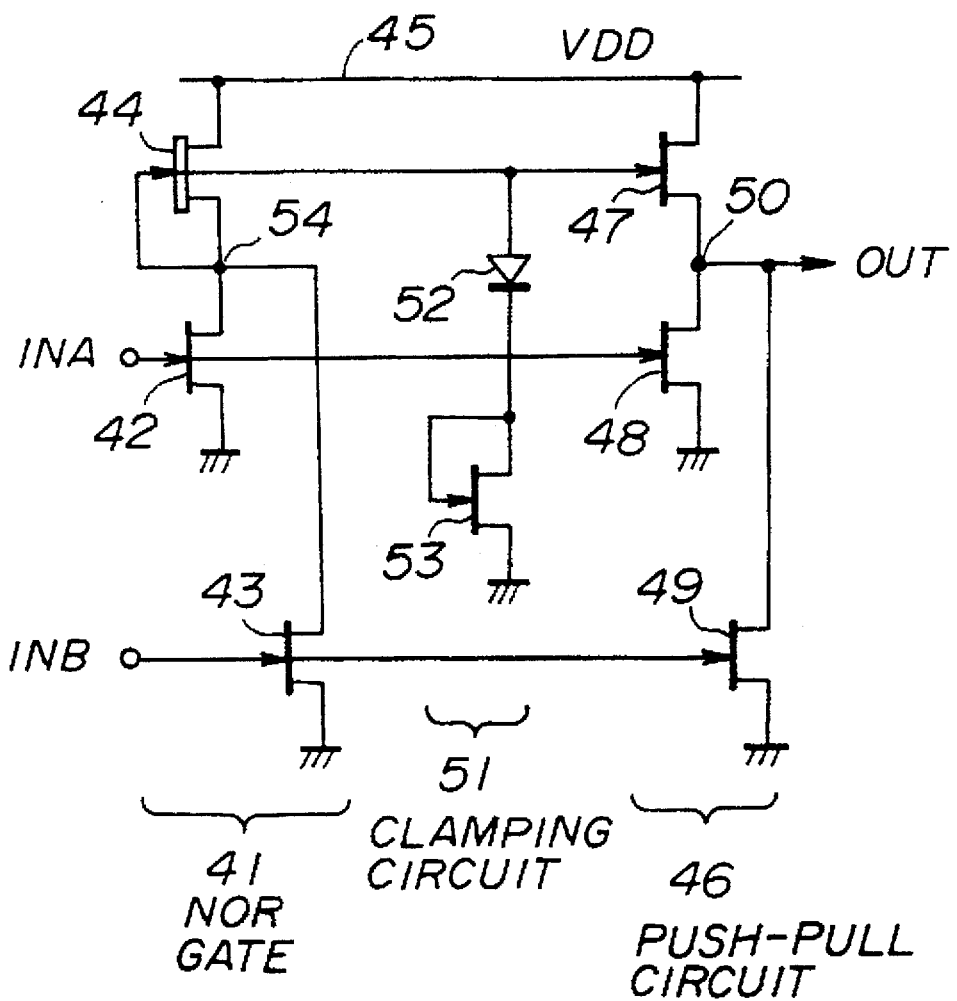
FIG. 6 is a circuit diagram illustrating a logic gate circuit according to a fourth embodiment of the present invention.

Referring to FIG. 6, a NOR gate 41 is formed as the logic gate stage. Input signals INA and INB are supplied to the NOR gate 41. Each of the input signals INA and INB may have, for example, the H-level of 0.7 volts and the L-level of 0 volts. The NOR gate 41 has enhancement-type MES FETs 42 and 43 for a driver and a depletion-type MES FET 44 for a load. The power supply line 45 (VDD) having, for example, a voltage of 2 volts is connected to the NOR gate 41.

A push-pull circuit 46 is formed as the output driver stage. The push-pull circuit 46 has an enhancement-type MES FET 47 for the pull-up and enhancement-type MES FETs 48 and 49 for the pull-down. A node 50 at which the enhancement-type MES FET 47 for the pull-up and the enhancement-type MES FET 48 for the pull-down are connected is formed as the output terminal. The output signal OUT is output from the node 50.

A clamping circuit 51 clamps the gate of the MES FET 47 when the output signal has the H-level. The clamping circuit 51 has a Schottky diode 52 and an enhancement-type MES FET 53 in a diode connection form.

In the fourth embodiment, when both of the input signals INA and INB have the H-level, the MES FETs 42 and 43 are in the ON state, a node 54 at which the MES FETs 42 are connected has the L-level, the MES FET 47 is in the OFF state and the MES FETs 48 and 49 are in the On state. As a result, the node 50 (the output signal OUT) has the L-level.

When the input signal INA has the H-level and the input signal INB has the L-level, the MES FET 42 is in the ON state, the MES FET 43 is in the OFF state, the node 54 has the L-level, the MES FET 47 is in the OFF state, the MES FET 48 is in the ON state and the MES FET 49 is in the OFF state. As a result, the node 50 (the output signal OUT) has the L-level.

When the input signal INA has the L-level and the input signal INB has the H-level, the MES FET 42 is in the OFF state, the MES FET 43 is in the ON state, the node 54 has the L-level, the MES FET 47 is in the OFF state, the MES FET 48 is in the OFF state and the MES FET 49 is in the ON state. As a result, the node 50 (the output signal OUT) has the L-level.

When both the input signal INA and INB have the L-level, the MES FETs 42 and 43 are in the OFF state, the node 54 has the H-level, the MES FET 47 is in the ON state and the MES FETs 48 and 49 are in the OFF state. As a result, the node 50 (the output signal OUT) has the H-level.

According to the fourth embodiment, since the push-pull circuit 46 formed as the output driver stage is provided in the post-stage for the NOR gate 41 formed as the logic gate stage, a large load drivability can be obtained.

In addition, in the fourth embodiment, the clamping circuit 51 is formed of the Schottky diode 52 and the MES FET 53, the Schottky diode 52 having the anode connected to the gate of the MES FET 47, and the MES FET 53 having the drain connected to the cathode of the Schottky diode 52, the gate connected to the drain and the source connected to the ground line. As a result, when the output signal OUT has the H-level, the gate voltage of the MES FET 47 is clamped to a voltage ($V_{DF}+V_{TH53}$), where $V_{DF}$ is the forward voltage of the Schottky diode 52 and $V_{TH53}$ is the threshold voltage. Thus, if the threshold voltage $V_{TH53}$ of the MES FET 53 is equal to the threshold voltage $V_{TH47}$ of the MES FET 47, a voltage at the node 50 does not exceed a voltage of ($V_{DF}+V_{TH53}-V_{TH47}=V_{DF}$). That is, the voltage at the node does not exceed the forward voltage $V_{DH}$ of the Schottky diode 52.

In this case, if the forward voltage $V_{DF}$ of the Schottky diode 52 is 0.7 volts and the threshold voltage $V_{TH47}$ of the MES FET 47 falls within a range of 0.1–0.2 volts ($V_{TH47}$= 0.1–0.2 volts), the node 50 has 0.7 volts in a state where the output signal OUT has the H-level. If the threshold voltage of the next stage circuit falls within a range of 0.3–0.5 volts, the input transistor in the next stage circuit can be in the ON state. In addition, when the level at the node 50 is switched from the L-level to the H-level, a current independent of the logical operation is prevented from flowing from the power supply line 45 to the input transistor in the next stage circuit via the MES FET 47. Thus, a low dissipation power can be obtained.

Additionally, in the fourth embodiment, the transistor for the pull-up in the push-pull circuit 46 is formed of the enhancement-type MES FET 47 which is not always in the ON state. That is, when the output signal OUT should have the H-level, the enhancement-type MES FET 47 is in the On state, and when the output signal OUT should have the L-level, the enhancement-type MES FET 47 is in the OFF state. Thus, the W/L ratio of the MES FETs 48 and 49 for the pull-down can be small, so that input capacity can be small.

As has been described above, according to the fourth embodiment, in the two-input NOR gate with the output driver circuit, a large load drivability can be obtained and the dissipation power and the input capacity can be decreased.

A description will now be given, with reference to FIG. 7, of a fifth embodiment in which the present invention is applied to a two-input NAND gate with an output driver circuit.

Figure 7:
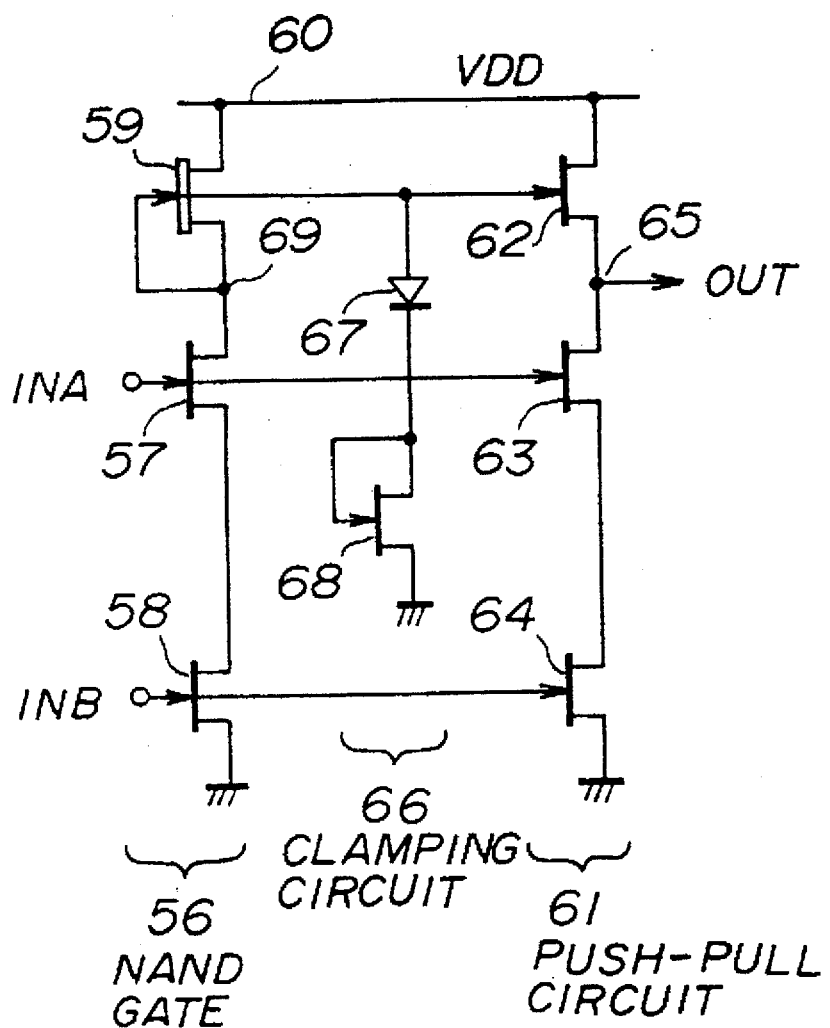
FIG. 7 is a circuit diagram illustrating a logic gate circuit according to a fifth embodiment of the present invention.

Referring to FIG. 7, a NAND gate 56 is formed as the logic gate stage. Input signals INA and INB are supplied to the NAND gate 56. Each of the input signals INA and INB may have the H-level, for example, of 0.7 volts, and the L-level, for example, of 0 volts. The NAND gate 56 has enhancement-type MES FETs 57 and 58 for a driver and depletion-type MES FET 59 for a load. A power supply line 60 (VDD) having, for example, a voltage of 2 volts is connected to the NAND gate 56.

A push-pull circuit 61 is formed as the output driver stage. The push-pull circuit 61 has an enhancement-type MES FET 62 for the pull-up and enhancement-type MES FET 63 and 64 for the pull-down. A node 65 at which the enhancement-type MES FET 62 for the pull-up and the enhancement-type MES FET 63 for the pull down are connected is formed as an output terminal. An output signal OUT is output from the node 65.

A clamping circuit 66 clamps the gate voltage of the MES FET 62 when the output signal OUT has the H-level. The clamping circuit 66 has a Schottky diode 67 and an enhancement-type MES FET 68 in a diode connection form.

In the fifth embodiment, when both of the input signals INA and INB have the H-level, the MES FETs 57 and 58 are in the ON state, a node 69 at which the depletion-type MES FET 59 for the load and the enhancement-type MES FET 57 for the driver are connected has the L-level, the MES FET 62 is in the OFF state, and the MES FETs 63 and 64 are in the ON state. As a result, the node 65 (the output signal OUT) has the L-level.

When the input signal INA has the H-level and the input signal INB has the L-level, the MES FET 57 is in the ON state, the MES FET 58 is in the OFF state, the node 69 has the H-level, the MES FET 62 is in the ON state, the MES FET 63 is in the ON state and MES FET 64 is in the OFF state. As a result, the node 65 (the output signal OUT) has the H-level.

When the input signal INA has the L-level and the input signal INB has the H-level, the MES FET 57 is in the OFF state, the MES FET 58 is in the ON state, the node 69 has the H-level, the MES FET 62 is in the ON state, the MES FET 63 is in the OFF state and the MES FET 64 is in the ON state. As a result, the node 65 (the output signal OUT) has the H-level.

When both of the input signals INA and INB have the L-level, the MES FET 57 is in the OFF state, the node 69 has the H-level, the MES FET 62 is in the ON state and the MES FETs 63 and 63 are in the OFF state. As a result, the node 65 (the output signal OUT) has the H-level.

According to the fifth embodiment, since the push-pull circuit formed as the output driver stage is provided in the post-stage for the NAND gate 56 formed as the logic gate stage, a large load drivability can be obtained.

In the fifth embodiment, the clamping circuit 66 having the Schottky diode 67 and the MES FET 68 is formed as follows. The anode of the Schottky diode is connected to the gate of the MES FET 62. The drain of the MES FET 68 is connected to the cathode of the Schottky diode 67, the gate and drain of the MES FET 68 are connected to each other, and the source of the MES FET 68 is connected to the ground line. As a result, when the output signal OUT has the H-level, the gate voltage of the MES FET 62 is clamped to a voltage ($V_{DF}+V_{TH68}$), where $V_{DF}$ is the forward voltage of the Schottky diode 67 and the $V_{TH68}$ is the threshold voltage of the MES FET 68. Thus, if the threshold voltage $V_{TH68}$ of the MES FET 68 is equal to the threshold voltage $V_{TH62}$ of the MES FET 62, the voltage at the node 65 does not exceed a voltage of ($V_{DF}+V_{TH68}-V_{TH62}=V_{DF}$). That is, the voltage of the node 65 does not exceed a voltage equal to the forward voltage $V_{DF}$ of the Schottky diode 67.

If the forward diode $V_{DF}$ of the Schottky diode 67 is equal to 0.7 volts ($V_{DF}$=0.7 volts) and the threshold voltage $V_{TH62}$ of the MES FET 62 falls within a range of 0.1–0.2 volts ($V_{TH62}$=0.1–0.2 volts), the voltage at the node 65 is 0.7 volts when the output signal OUT has the H-level. In this case, if the threshold voltage in the next stage circuit falls within a range of 0.3–0.5 volts, the input transistor in the next stage circuit can be made to be in the ON state. In addition, when the level of the node 65 is switched from the L-level to the H-level, a current independent of the logical operation can be prevented from flowing from the power supply line 60 (VDD) to the input transistor in the next stage circuit. Thus, the dissipation power can be decreased.

In the fifth embodiment, the transistor for the pull-up in the push-pull circuit 61 is formed of the enhancement-type MES FET 62 which is not always in the ON state. That is, when the output signal OUT should have the H-level, the MES FET 62 is in the ON state, and when the output signal OUT should have the L-level, the MES FET 62 is in the OFF state. Thus, the W/L ratio of the MES FETs 63 and 64 for the pull-down can be small, so that the input capacity can be small.

As has been described above, according to the fifth embodiment of the present invention, in the two-input NAND gate with the output driver circuit, a large load drivability can be obtained and the dissipation power and the input capacity can be lowered.

A description will now be given, with reference to FIG. 8, of a sixth embodiment of the present invention. The sixth embodiment relates to a TTL output buffer in which the logic gate circuit according to the second embodiment as shown in FIG. 4 is used.

Figure 8:
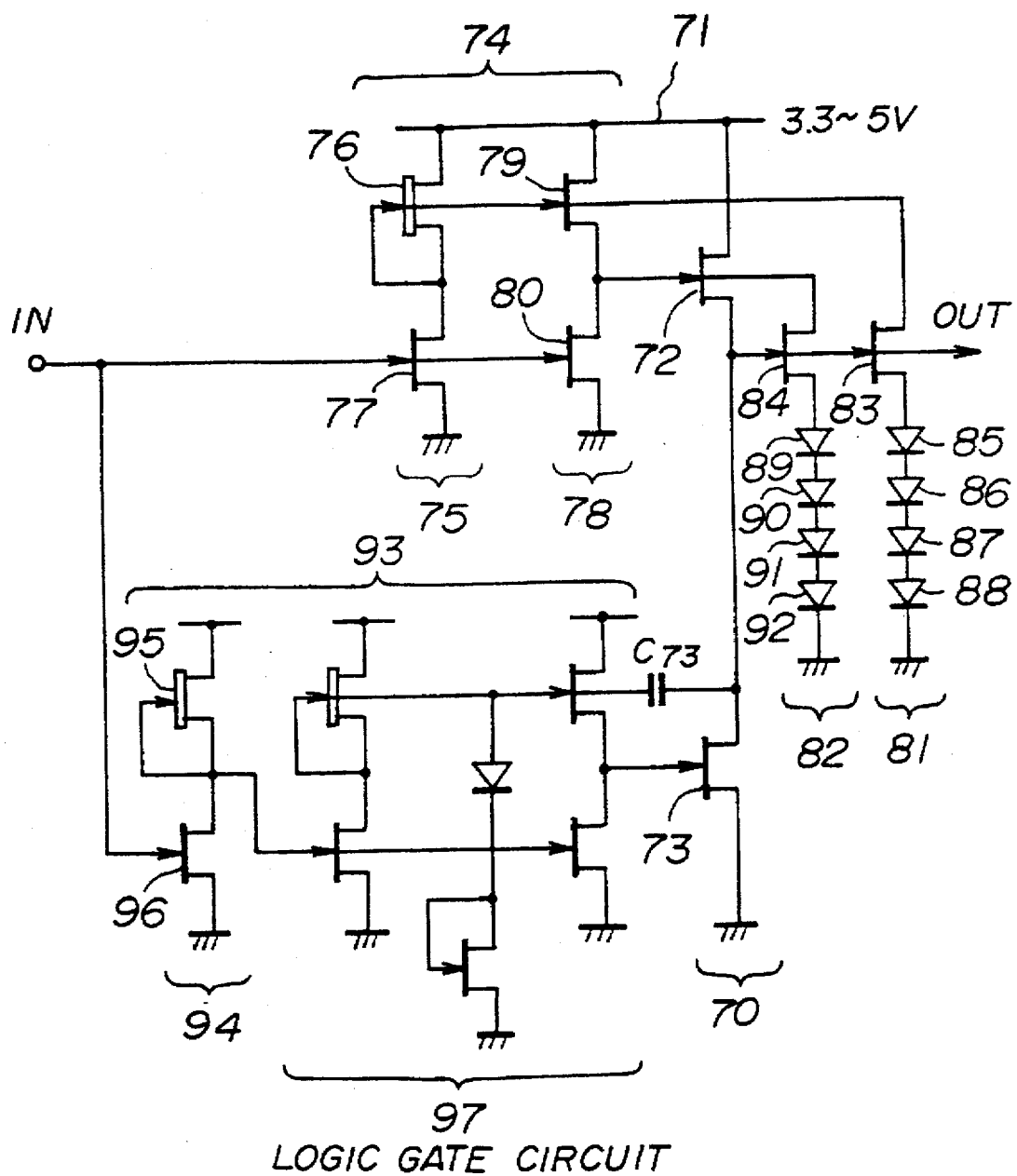
FIG. 8 is a circuit diagram illustrating a logic gate circuit according to a sixth embodiment of the present invention.

Referring to FIG. 8, the TTL output buffer has a push-pull circuit 70, a pull-up control circuit 74, clamping circuits 81 and 82 and a pull-down control circuit 93. This output buffer is connected to a power supply line 71 for supplying thereto a voltage corresponding to a high voltage falling within a range of, for example, 3.3–5 volts in the TTL level. The push-pull circuit 70 has an enhancement-type MES FET 72 for the pull-up and an enhancement-type MES FET 73 for the pull-down.

The pull-up control circuit 74 has an inverter 75 and a push-pull circuit 78. The inverter 75 comprises a depletion-type MES FET 76 for a load and an enhancement-type MES FET 77 for a driver. The push-pull circuit 78 comprises an enhancement-type MES FET 79 for the pull-up and an enhancement-type MES FET 79 for the pull-down.

The clamping circuit 81 has an enhancement-type MES FET 83 and Schottky diodes 85–88. The clamping circuit 82 has an enhancement-type MES FET 84 and Schottky diodes 89–92. The clamping circuits 81 and 82 clamp the output voltage OUT at an appropriate voltage.

The pull-down control circuit 93 has an inverter and a logic gate circuit 97. The inverter has a depletion-type MES FET 95 for a load and an enhancement-type MES FET 96 for a driver. The logic gate circuit 97 has the structure shown in FIG. 4. A capacitor $C_{73}$ for controlling the slew rate is provided between the pull-down circuit 93 and the push-pull circuit 70.

In the sixth embodiment, when the input signal IN has the H-level (the GaAs level), the MES FET 77 is in the ON state, the drain of the MES FET 77 has the L-level, the MES FET 79 is in the OFF state, the MES FET 80 is in the ON state, the gate of the MES FET 72 has the L-level and the MES FET 72 is in the OFF state. Further, the MES FET 96 is in the ON state, the drain of the MES FET 96 has the L-level, the output of the logic gate 97 has the H-level and the MES FET 73 is in the ON state. As a result, the output signal OUT has the L-level (the TTL level).

On the other hand, when the input signal IN has the L-level (the GaAs level), the MES FET 77 is in the OFF state, the drain of the MES FET 77 has the H-level, the MES FET 79 is in the On state, the MES FET 80 is in the OFF state, the gate of the MES FET 72 has the H-level and the MES FET 72 is in the ON state. Further, the MES FET 69 is in the OFF state, the drain of the MES FET 69 has the H-level, the output of the logic gate 97 has the L-level and the MES FET 73 is in the OFF state. As a result, the output signal OUT has the H-level (the TTL level).

In the sixth embodiment, since the push-pull circuit 70 is formed as the output driver stage, a large load drivability can be obtained.

In addition, the output voltage OUT is clamped at the appropriate voltage by the clamping circuit 81 and 82. Thus, when the level of the output signal OUT is switched from the L-level to the H-level, a current which flows from the power supply line 71 to the input transistor in the next stage circuit via the MES FET 72 can be minimized. Thus, the dissipation power can be decreased.

The clamping circuit 82 does not have to be provided, and may be omitted.

A description will now be given, with reference to FIG. 9, of a seventh embodiment of the present invention. The seventh embodiment relates to a TTL output driver in which the logic gate according to the fourth embodiment shown in FIG. 6 is provided.

Figure 9:
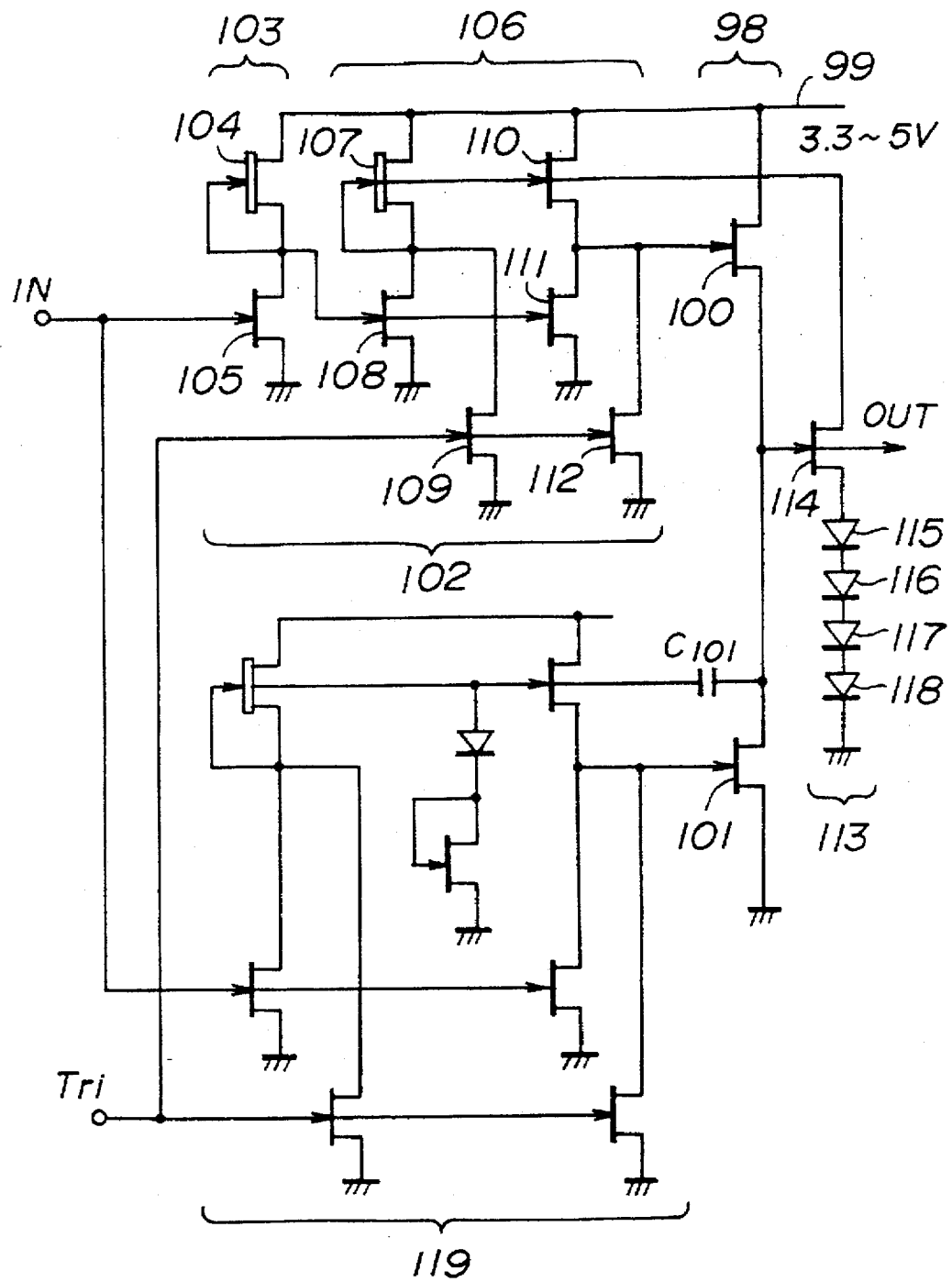
FIG. 9 is a circuit diagram illustrating a logic gate circuit according to a seventh embodiment of the present invention.

Referring to FIG. 9, the TTL output driver has a push-pull circuit 98, a pull-up control circuit 102, a clamping circuit 113 and a logic gate circuit 119. The push-pull circuit 98 has an enhancement-type MES FET for the pull-up and an enhancement-type MES FET 101 for the pull-down. A power supply line 99 has a voltage corresponding to a high voltage of the TTL level (e.g. 3.3–5 volts).

The pull-up control circuit 102 controls the MES FET 100 of the push-pull circuit 98 so that the MES FET 100 is turned on or off. The pull-up control circuit 102 has an inverter 103 and a two-input NOR gate 106. The inverter 103 is formed of a depletion-type MES FET 104 for a load and an enhancement-type MES FET 105 for a driver. The two-input NOR gate 106 has a depletion-type MES FET 107 and enhancement-type MES FETs 108–112. A tristate signal is supplied to the gate of each of the MES FETs 109 and 110 in the two-input NOR gate 106.

The clamping circuit 113 has an enhancement-type MES FET 114 and Schottky diodes 115–118. The clamping circuit 113 clamps the level of the output signal OUT at an appropriate voltage.

The logic gate 119 (the two-input NOR gate with the output driver circuit) has the structure shown in FIG. 6 (in the fourth embodiment). The logic gate 119 is used as a pull-down control circuit for controlling the MES FET 101 so that the MES FET 101 is turned on or off. A capacitor $C_{101}$ for the slew rate control is provided between the logic gate 119 and the push-pull circuit 98. The tristate signal Tri is supplied to the logic gate 119.

In the seventh embodiment, when the tristate signal has the H-level, the MES FET 112 is in the ON state, the gate of the MES FET 100 has the L-level, the MES FET is in the OFF state, the output of the logic gate circuit 119 has the L-level and the MES FET 101 is in the OFF state. Thus, in this case, the output of the TTL output buffer is in a high impedance state.

On the other hand, when the tristate signal has the L-level, the MES FETs 109 and 112 are in the OFF state. In this state, when the input signal IN has the H-level (the GaAs level), the MES FET 105 is in the ON state and the drain of the MES FET 105 has the L-level. As a result, the MES FET 108 and 111 are in the OFF state, the drain of the MES FET 108 has the H-level, the MES FET 110 is in the ON state, the gate of the MES FET 100 has the H-level and the MES FET 100 is in the ON state. If the output of the logic gate circuit 119 has the L-level, the MES FET 101 is in the OFF state. Thus, in this case, the output signal OUT has the H-level (the TTL level).

Further, in the state where the tristate signal has the L-level, when the input signal IN has the L-level (the GaAs level), the MES FET 105 is in the OFF state and the drain of the MES FET 105 has the H-level. As a result, the MES FETs 108 and 110 are in the ON state, the drain of the MES FET 108 has the L-level, the MES FET 110 is in the OFF state, the gate of the MES FET 110 has the L-level and the MES FET 110 is in the OFF state. If the output of the logic gate circuit 119 has the H-level, the MES FET 101 is in the ON state. Thus, in this case, the output signal OUT has the L-level (the TTL level).

In the seventh embodiment, since the push-pull circuit 98 is formed as the output driver stage, a large load drivability can be obtained.

In addition, the clamping circuit 113 is provided so that the output of the push-pull circuit 98 (the output signal OUT) is clamped at an appropriate level. Thus, when the output signal is inverted from the L-level to the H-level, a current which flows from the power supply line 99 to the input transistor in the next stage circuit via the MES FET 100 can be minimized. As a result, the dissipation power can be decreased.

A description will now be given, with reference to FIG. 10, of an eighth embodiment of the present invention. The eighth embodiment relates to an TTL output buffer to which the present invention is applied.

Figure 10:
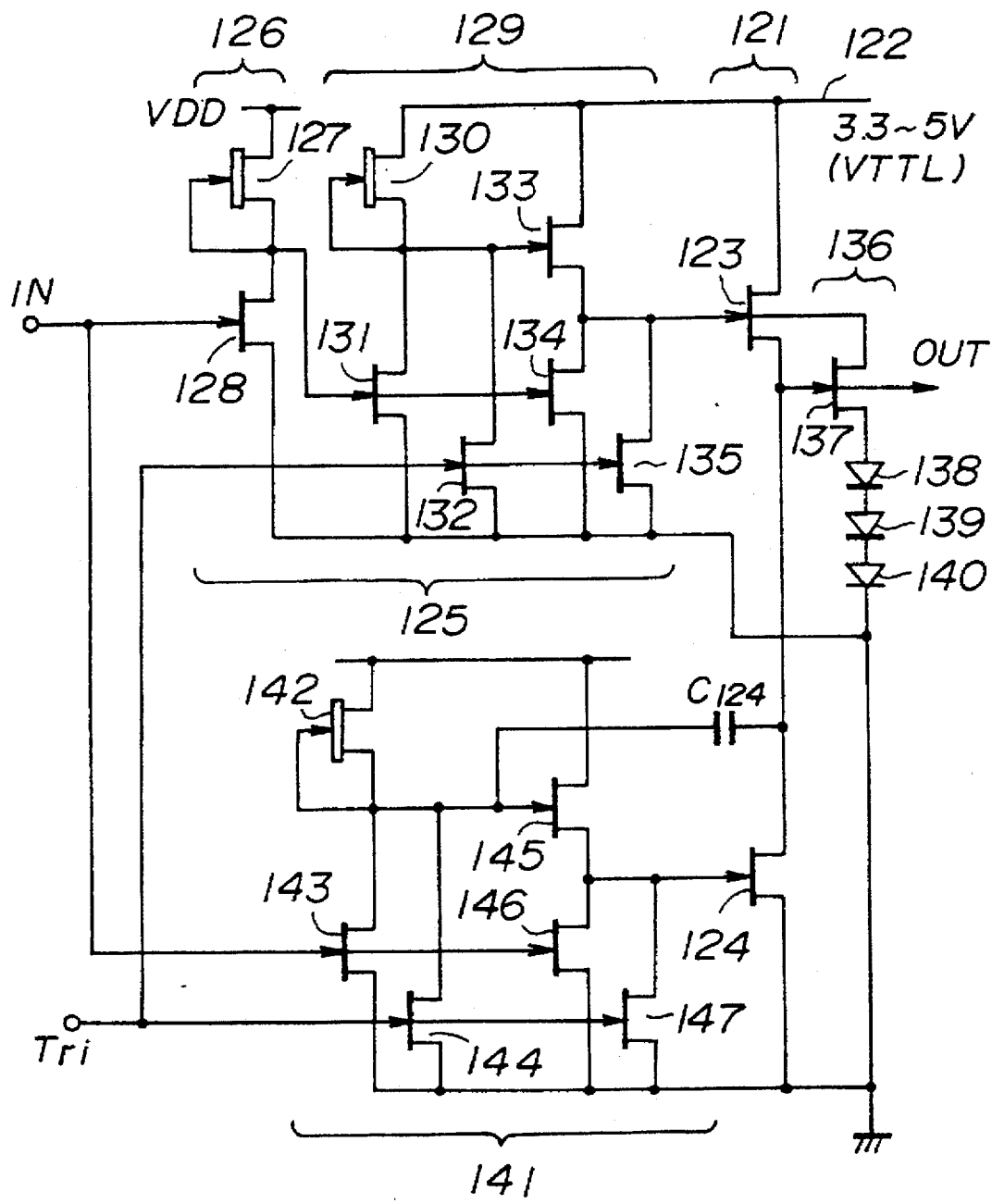
FIG. 10 is a circuit diagram illustrating a logic gate circuit according to an eighth embodiment of the present invention.

Referring to FIG. 10, the TTL output buffer has a push-pull circuit 121, a pull-up control circuit 125, a clamping circuit 136 and a pull-down circuit 141. A power supply line 122 has a voltage corresponding to a high voltage of the TTL level. The push-pull circuit 11 has an enhancement-type MES FET 123 for the pull-up and an enhancement-type MES FET 124 for the pull-down.

The pull-up control circuit 125 controls the MES FET 123 so that the MES FET 123 is turned on or off. The pull-up control circuit 125 has an inverter 126 and a two-input NOR gate 129. The inverter is formed of a depletion-type MES FET 127 for a load and an enhancement-type MES FET 128 for a driver. The two-input NOR gate 129 has a depletion-type MES FET 130 and enhancement-type MES FETs 131–135. A tristate signal Tri is supplied to the MES FETs 132 and 135 of the two-input NOR circuit 129.

The clamping circuit is formed of an enhancement-type MES FET 137 and Schottky diodes 138–140. The clamping circuit 136 clamps the level of the output signal OUT at an appropriate level when the output signal OUT has the H-level.

The pull-down control circuit 141 is formed of a two-input NOR gate and controls the MES FET 124 so that the MES FET 124 is turned on or off. The pull-down control circuit 141 has a depletion-type MES FET 142 and enhancement-type MES FETs 143–147. A capacitor $C_{124}$ for the slew rate control is provided between the pull-down control circuit 141 and the push-pull circuit 121.

In the eighth embodiment, when the tristate signal has the H-level, the MES FET 135 is in the ON state, the gate of the MES FET 123 has the L-level, the MES FET 123 is in the OFF state, the MES FET 147 is in the ON state, the gate of the MES FET 124 has the L-level and the MES FET 124 is in the OFF state. Thus, in this case, the output of this TTL output buffer is in the high impedance state.

On the other hand, in a state where the tristate signal Try has the L-level so that the MES FETs 132, 135, 144 and 147 are in the OFF state, when the input signal IN has the H-level (the GaAs level), the MES FET 128 is in the ON state and the drain of the MES FET 128 has the L-level. As a result, the MES FETs 131 and 134 are in the OFF state, the drain of the MES FET 131 has the H-level, the MES FET 133 is in the ON state, the gate of the MES FET 123 has the H-level and the MES FET 123 is in the ON state. Further, the MES FETs 143 and 146 are in the ON state, the drain of the MES FET 143 has the L-level, the MES FET 145 is in the OFF state, the gate of the MES FET 124 has the L-level and the MES FET 124 is in the OFF state. Thus, in this case, the output signal OUT has the H-level (the TTL level).

Further, in the state where the tristate signal Tri has the L-level, when the input signal IN has the L-level (the GaAs level), the MES FET 128 is in the OFF state and the drain of the MES FET 128 has the H-level. As a result, the MES FETs 131 and 134 are in the ON state, the drain of the MES FET 131 has the L-level, the MES FET 133 is in the OFF state, the gate of the MES FET 123 has the L-level and the MES FET 123 is in the OFF state. Further, the MES FETs 143 and 146 are in the OFF state, the drain of the MES FET 143 has the H-level, the MES FET 134 is in the ON state, the gate of the MES FET 124 has the H-level and the MES FET 124 is in the ON state. Thus, in this case, the output signal OUT has the L-level (the TTL level).

In the eighth embodiment, since the push-pull circuit 121 is formed as the output driver stage, a large load drivability can be obtained.

In addition, the clamping circuit 136 is provided so that the level of the output of the push-pull circuit 121 (the output signal OUT) is clamped at an appropriate level when the output signal OUT has the H-level. Thus, when the output signal OUT is inverted from the L-level to the H-level, a current which flows from the power supply line 122 into the input transistor in the next stage circuit can be minimized. As a result, the dissipation power can be decreased.

A description will now be given, with reference to FIG. 11, of a ninth embodiment of the present invention. The ninth embodiment relates to an ECL input buffer to which the present invention is applied.

Figure 11:
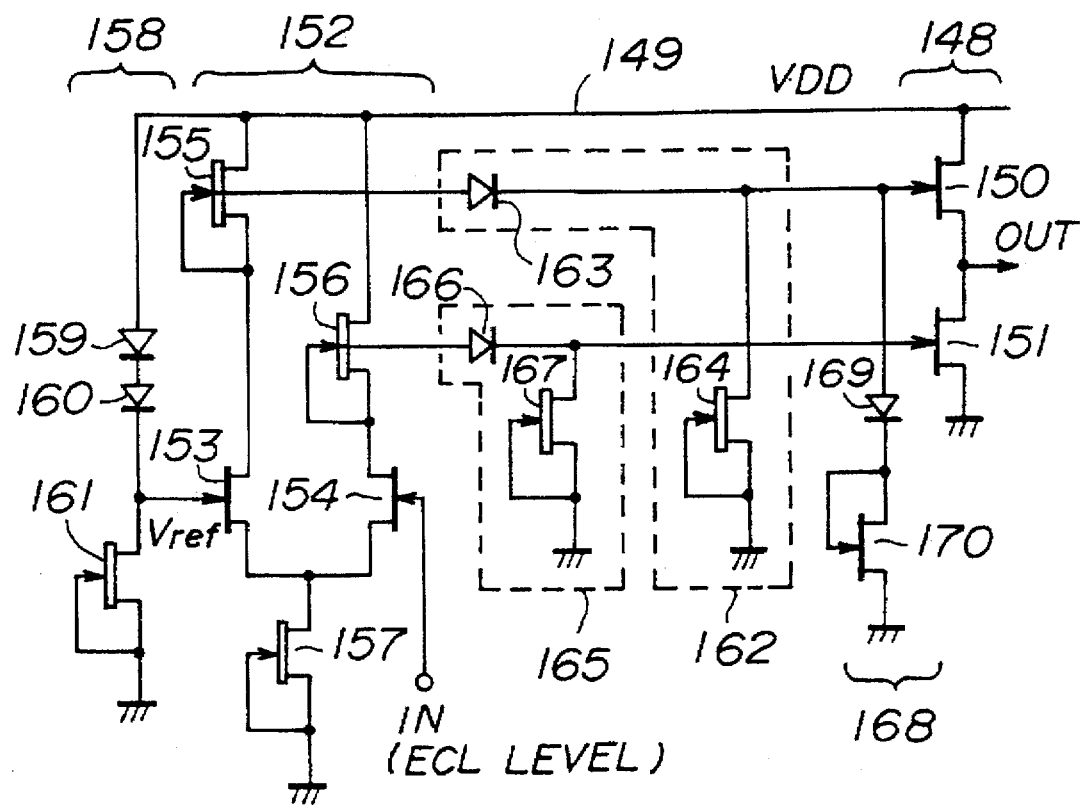
FIG. 11 is a circuit diagram illustrating a logic gate circuit according to a ninth embodiment of the present invention.

Referring to FIG. 11, the ECL input buffer has a push-pull circuit 148, a differential amplifier circuit 152, a reference voltage generating circuit 158, a pull-up control circuit 162, a pull-down control circuit 165 and a clamping circuit 168. A power supply line 149 has a predetermined voltage (VDD). The push-pull circuit 148 is formed of an enhancement-type MES FET 150 for the pull-up and an enhancement-type MES FET 151 for the pull-down.

The differential amplifier circuit 152 has enhancement-type MES FETs 153 and 154 for a driver, depletion-type MES FETs 155 and 156 for a load and a depletion-type MES FET 157 formed as a constant current source.

The reference voltage generating circuit 158 is formed of Schottky diodes 159 and 160 for a load and a depletion-type MES FET 161 formed as a constant current source. A reference voltage Vref output from the reference voltage generating circuit 158 is supplied to the differential amplifier circuit 152.

The pull-up control circuit 162 controls the MES FET 150 so that the MES FET 150 is turned on or off. The pull-up control circuit 162 has a Schottky diode 163 and a depletion-type MES FET 164.

The pull-down control circuit 165 controls the MES FET 151 so that the MES FET 151 is turned on or off. The pull-down control circuit 165 has a Schottky diode 166 and a depletion-type MES FET 167.

The clamping circuit 168 has a Schottky diode 169 and an enhancement-type MES FET 170. The clamping circuit 168 clamps the level of the output signal OUT at a voltage corresponding to the forward voltage of the Schottky diode 169 when the output signal OUT has the H-level.

In the ninth embodiment, when the input signal IN has the H-level (the ECL level), the MES FET 153 is in the OFF state, the drain of the MES FET 153 has the H-level, the MES FET 154 is in the ON state and the drain of the MES FET 154 has the L-level. As a result, the MES FET 150 is in the ON state and the MES FET 151 is in the OFF state. Thus, the output signal OUT has the H-level (the GaAs level).

On the other hand, when the input signal IN has the L-level (the ECL level), the MES FET 153 is in the ON state, the drain of the MES FET 153 has the L-level, the MES FET 154 is in the OFF state and the drain of the MES FET 154 has the H-level. As a result, the MES FET 150 is in the OFF state and the MES FET 151 is in the ON state. Thus, the output signal OUT has the L-level (the GaAs level).

In the ninth embodiment, since the push-pull circuit 148 is formed as the output driver stage, a large load drivability can be obtained.

In addition, the clamping circuit is provided so that the level of the push-pull circuit 148 (the output signal OUT) is clamped at an appropriate level when the output signal OUT has the H-level. Thus, when the output signal OUT is inverted from the L-level to the H-level, a current which flows from the power supply line 149 into the input transistor in the next stage circuit via the MES FET 150 can be minimized.

A description will now be given, with reference to FIG. 12, of a tenth embodiment of the present invention. The tenth embodiment relates to a TTL input buffer to which the present invention is applied.

Figure 12:
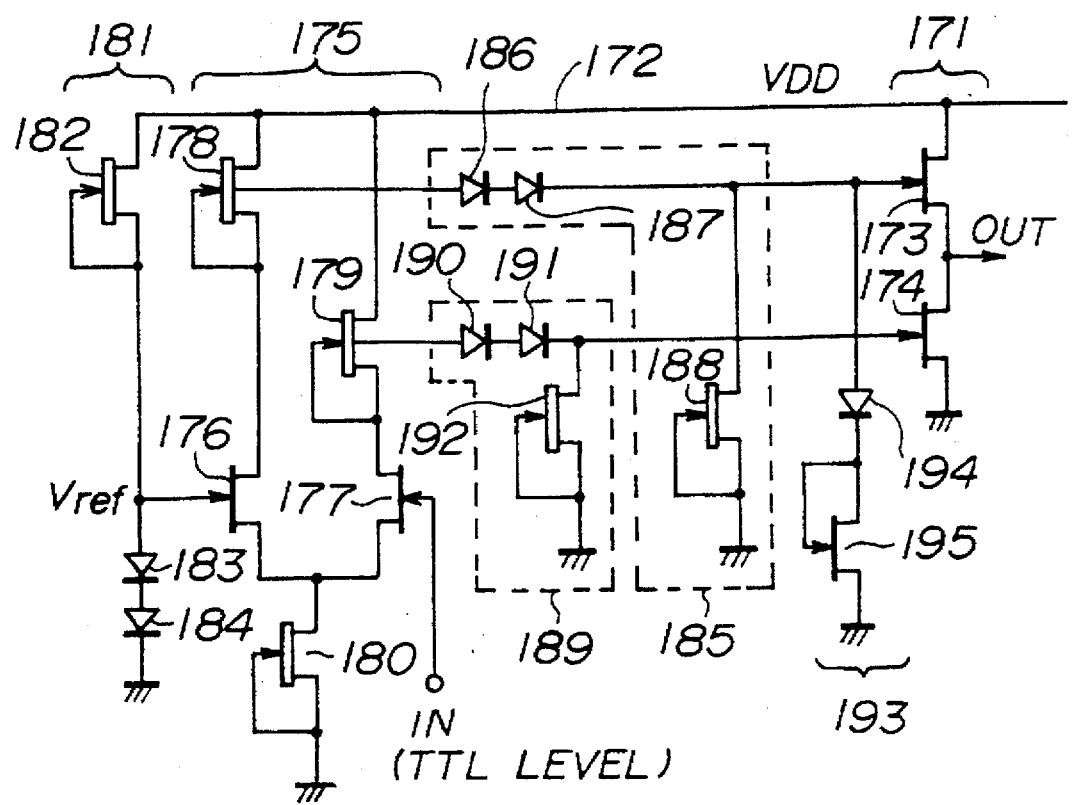
FIG. 12 is a circuit diagram illustrating a logic gate circuit according to a tenth embodiment of the present invention.

Referring to FIG. 12, the TTL input buffer has a push-pull circuit 171, a differential amplifier circuit 175, a reference voltage generating circuit 181, a pull-up control circuit 185, a pull-down control circuit 189 and a clamping circuit 193. A power supply line 172 has a predetermined voltage VDD. The push-pull circuit 171 is formed of an enhancement-type MES FET 173 for the pull-up and an enhancement-type MES FET 174 for the pull-down.

The differential amplifier circuit 175 has enhancement-type MES FETs 176 and 177 for a driver, depletion-type MES FETs 178 and 179 for a load, and a depletion-type MES FET 180 formed as a constant current source.

The reference voltage generating circuit 181 has a depletion-type MES FET 182 formed as a constant current source and Schottky diodes 183 and 184 for a load. A reference voltage Vref output from the reference voltage generating circuit 181 is supplied to the differential amplifier circuit 175.

The pull-up control circuit 185 controls the MES FET 173 so that the MES FET 173 is turned on or off. The pull-up control circuit 185 has Schottky diodes 186 and 187 and a depletion-type MES FET 188.

The pull-down control circuit 189 controls the MES FET 174 so that the MES FET 174 is turned on or off. The pull-down control circuit 185 has Schottky diodes 190 and 191 and a depletion-type MES FET 192.

The clamping circuit 193 is formed of a Schottky diode 194 and an enhancement-type MES FET 195. The clamping circuit 193 clamps the level of the output signal OUT at a voltage corresponding to the forward voltage of the Schottky diode 194 when the output signal OUT has the H-level.

In the tenth embodiment, when the input signal has the H-level (the TTL level), the MES FET 176 is in the OFF state, the drain of the MES FET 176 has the H-level, the MES FET 177 is in the ON state and the drain of the MES FET 177 has the L-level. As a result, the MES FET 173 is in the ON state and the MES FET 174 is in the OFF state. Thus, the output signal OUT has the H-level (the GaAs level).

On the other hand, when the input signal IN has the L-level (the TTL level), the MES FET 176 is in the ON state and the drain of the MES FET 176 has the L-level, the MES FET 177 is in the OFF state and the drain of the MES FET 177 has the H-level. As a result, the MES FET 173 is in the OFF state and the MES FET 174 is in the ON state. Thus, the output signal OUT has the L-level (the GaAs level).

In the tenth embodiment, since the push-pull circuit 171 is formed as the output driver stage, a large load drivability can be obtained.

In addition, the clamping circuit 193 is provided so that the level of the output of the push-pull circuit (the output signal OUT) is clamped at an appropriate voltage when the output signal OUT has the H-level. Thus, when the output signal OUT is inverted from the L-level to the H-level, a current which flows from the power supply line 172 into the input transistor in the next stage circuit via the MES FET 173 can be minimized. As a result, the dissipation power can be decreased.

A description will now be given, with reference to FIG. 13, of an eleventh embodiment of the present invention. The eleventh embodiment relates to a TTL output buffer to which the present invention is applied.

Figure 13:
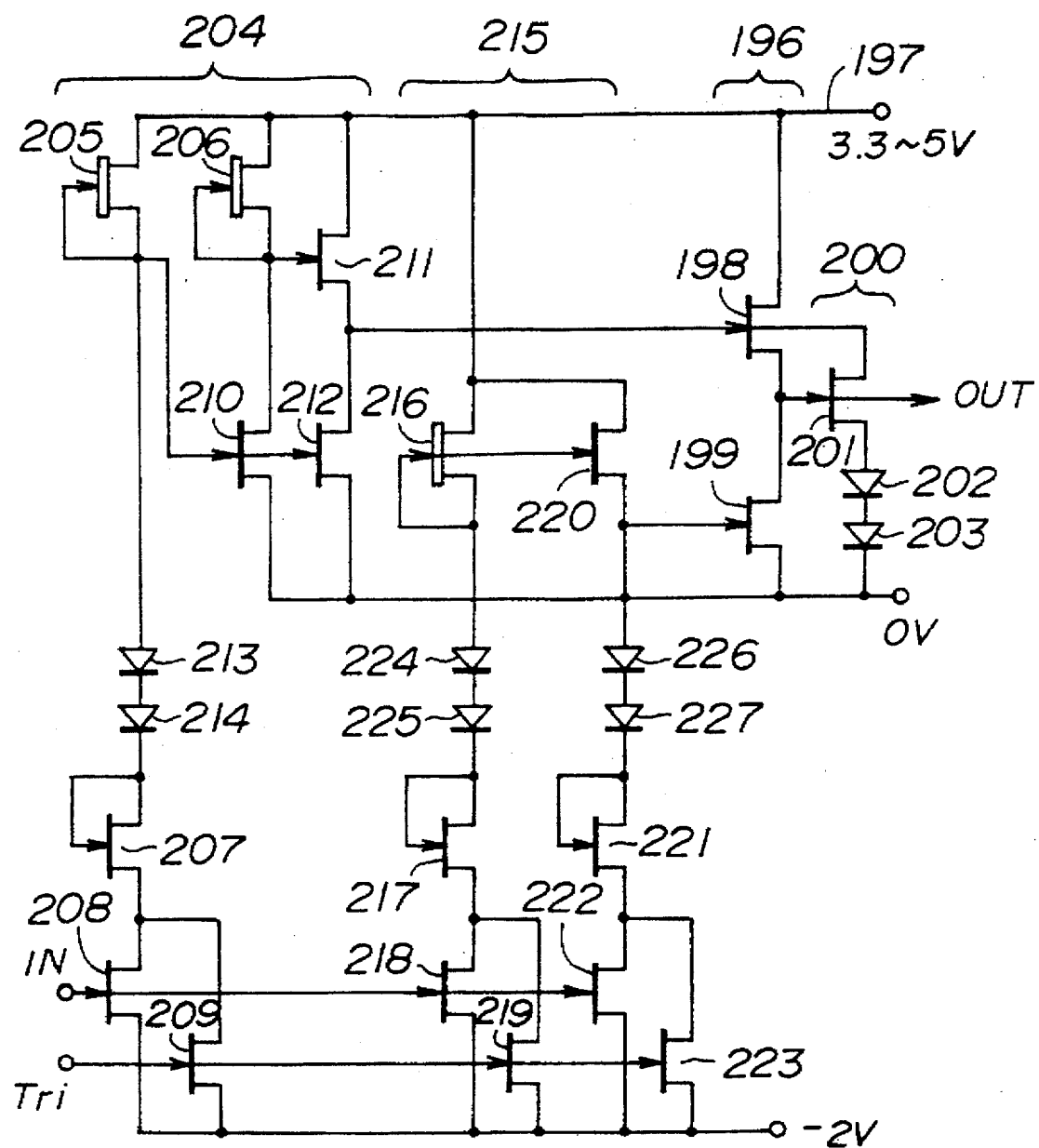
FIG. 13 is a circuit diagram illustrating a logic gate circuit according to a eleventh embodiment of the present invention.

Referring to FIG. 13, the TTL output buffer has a push-pull circuit 196, a clamping circuit 200, a pull-up control circuit 204 and a pull-down control circuit 215. A power supply line 197 has a voltage corresponding to a high voltage in the TTL level. The push-pull circuit 196 is formed of an enhancement-type MES FET 198 for the pull-up and an enhancement-type MES FET 199 for the pull-down.

The clamping circuit 200 has an enhancement-type MES FET 201 and Schottky diodes 202 and 203. The clamping circuit 200 clamps the level of the output signal OUT at an appropriate voltage when the output signal OUT has the H-level.

The pull-up control circuit 204 controls the MES FET 198 so that the MES FET 198 is turned on or off. The pull-up control circuit 204 has depletion-type MES FETs 205 and 206, enhancement-type MES FETs 207–212 and Schottky diodes 213 and 213.

The pull-down control circuit 215 controls the MES FET 199 so that the MES FET 199 is turned on or off. The pull-down control circuit 215 has a depletion-type MES FET 216, enhancement-type MES FETs 217–223 and Schottky diodes 224–227.

In the eleventh embodiment, in a state where the tristate signal Tri has the L-level (the GaAs level) so that the MES FETs 209, 219 and 223 are in the OFF state, when the input signal IN has the H-level (the GaAs level), the MES FET 208 is in the ON state and the source of the MES FET 205 has the L-level. As a result, the MES FETs 210 and 212 are in the OFF state, the drain of the MES FET 210 has the H-level, the MES FET 211 is in the ON state, the source of the MES FET 211 has the H-level and the MES FET 198 is in the ON state. Further, the MES FETs 218 and 222 are in the ON state, the source of the MES FET 216 has the L-level, the MES FET 220 is in the OFF state, the source of the MES FET 220 has the L-level and the MES FET 199 is in the ON state. Thus, in this case, the output signal OUT has the H-level.

On the other hand, in the state where the tristate signal Tri has the L-level, when the input signal IN has the L-level (the GaAs level), the MES FET 208 is in the OFF state and the source of the MES FET 205 has the H-level. As a result, the MES FETs 210 and 212 are in the ON state, the drain of the MES FET 210 has the L-level, the MES FET 211 is in the OFF state, the source of the MES FET 211 has the L-level and the MES FET 198 is in the OFF state. Further, the MES FETs 218 and 222 are in the OFF state, the source of the MES FET 216 has the H-level, the MES FET 220 is in the ON state, the source of the MES FET 220 has the H-level and the MES FET 199 is in the ON state. Thus, in this case, the output signal OUT has the L-level.

In the eleventh embodiment, since the push-pull circuit 196 is formed as the output driver stage, a large load drivability can be obtained. In addition, the clamping circuit 200 is provided so that the level of the output of the push-pull circuit 196 (the output signal OUT) is clamped at an appropriate voltage. Thus, when the output signal OUT is inverted from the L-level to the H-level, a current which flows from the power supply line into the input transistor in the next stage circuit via the MES FET 198 can be minimized. As a result, the dissipation power can be decreased.

A description will now be given, with reference to FIG. 14, of a first use example. The first use example relates to an inverting buffer circuit in which the logic gate circuit according to the second embodiment shown in FIG. 4 and the logic gate circuit according to the third embodiment shown in FIG. 5 are used.

Figure 14:
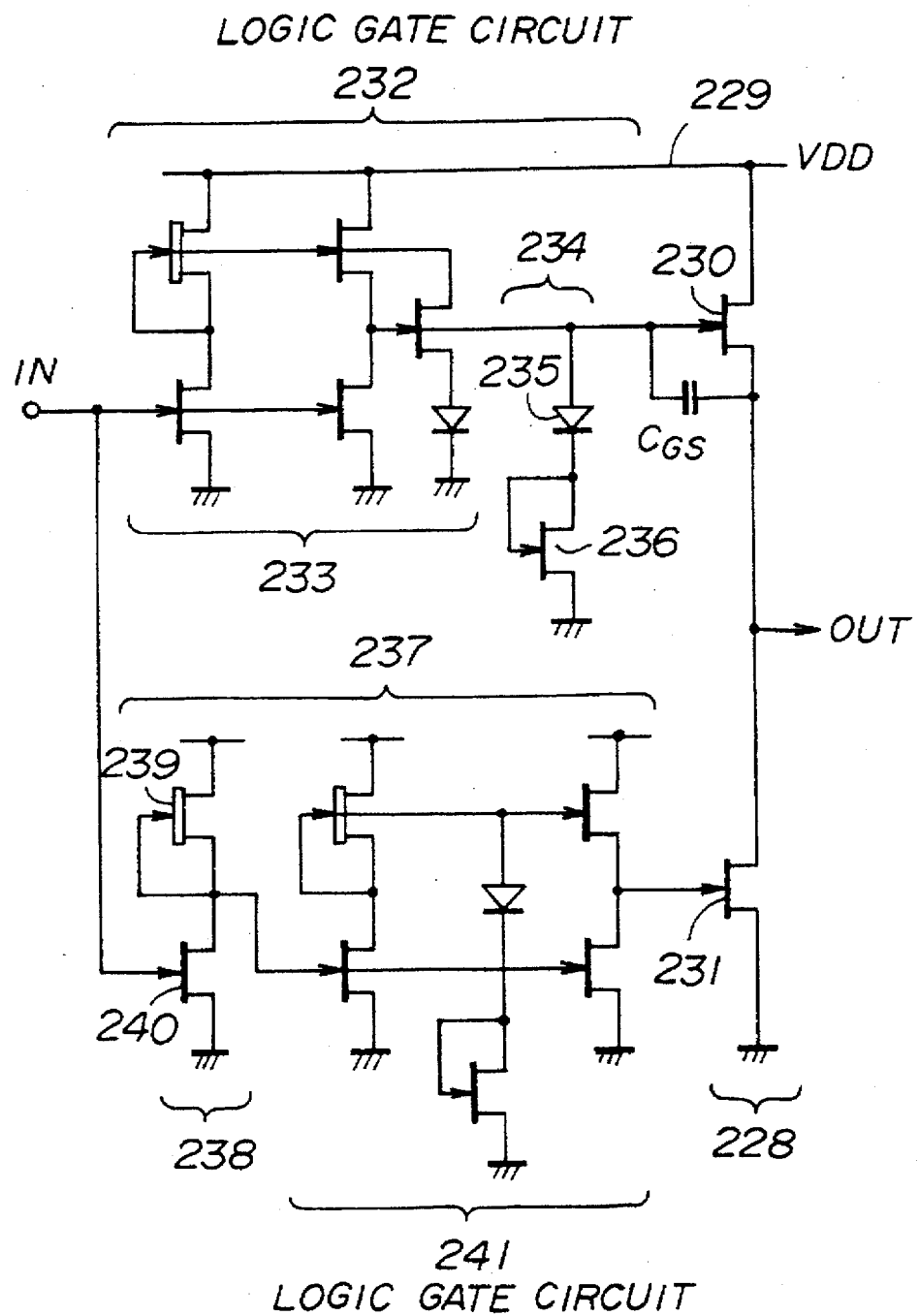
FIG. 14 is a circuit diagram illustrating an inverting buffer circuit in which the logic gate circuit according to the present invention is used as an example.

Referring to FIG. 14, the inverting buffer circuit has a push-pull circuit 228, a pull-up control circuit 232 and a pull-down control circuit 237. A power supply line 229 has a predetermined voltage (VDD). The push-pull circuit 228 is formed of an enhancement-type MES FET 230 for the pull-up and an enhancement-type MES FET 231 for the pull-down.

The pull-up control circuit 232 controls the MES FET 230 so that the MES FET 230 is turned on or off. The pull-up control circuit 232 has the logic gate circuit 233 having the same structure as that in the third embodiment shown in FIG. 5 and a clamping circuit 234. The clamping circuit 234 restrains the increasing of the gate voltage of the MES FET 230 caused by the bootstrap of a capacitance $C_{GS}$ between the gate and drain of the MES FET 230. The clamping circuit 234 is formed of a Schottky diode 235 and an enhancement-type MES FET 236 connected to the Schottky diode 235. The clamping circuit 234 is not absolutely needed and can be omitted.

Figure 4:
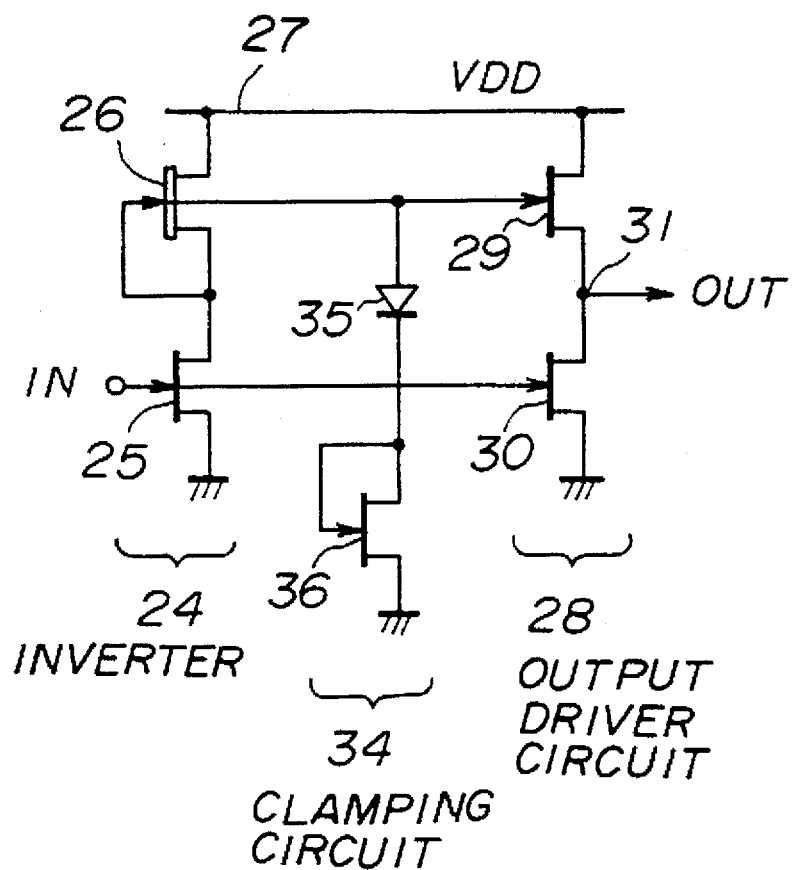
FIG. 4 is a circuit diagram illustrating a logic gate circuit according to a second embodiment of the present invention.

The pull-down control circuit 237 has an inverter 238 used as an input circuit and a logic gate circuit 241 having the same structure as that in the second embodiment shown in FIG. 4. The pull-down control circuit 237 controls the MES FET 231 so that the MES FET is turned on or off. The inverter 238 is formed of a depletion-type MES FET 239 for a load and an enhancement-type MES FET 240 for a driver.

Figure 16:
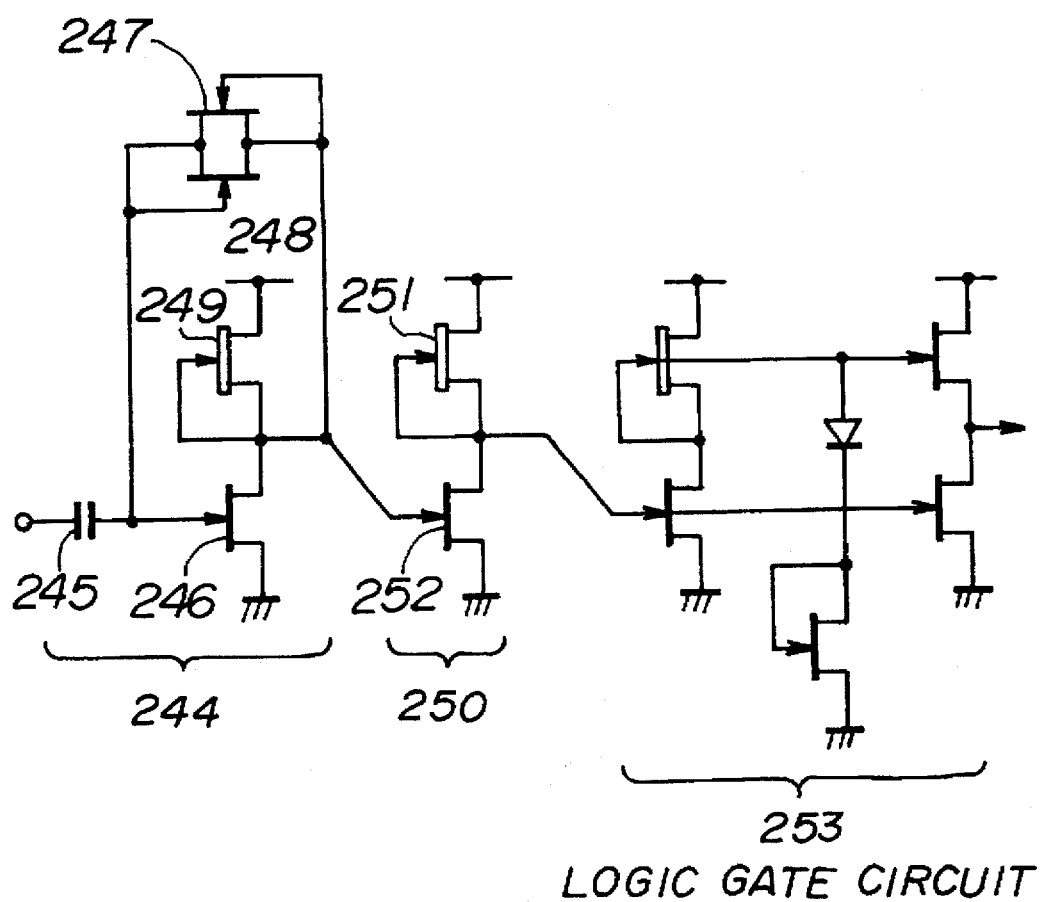
FIG. 16 is a circuit diagram illustrating a structure of an input buffer in the prescaler shown in FIG. 15.
Figure 17:
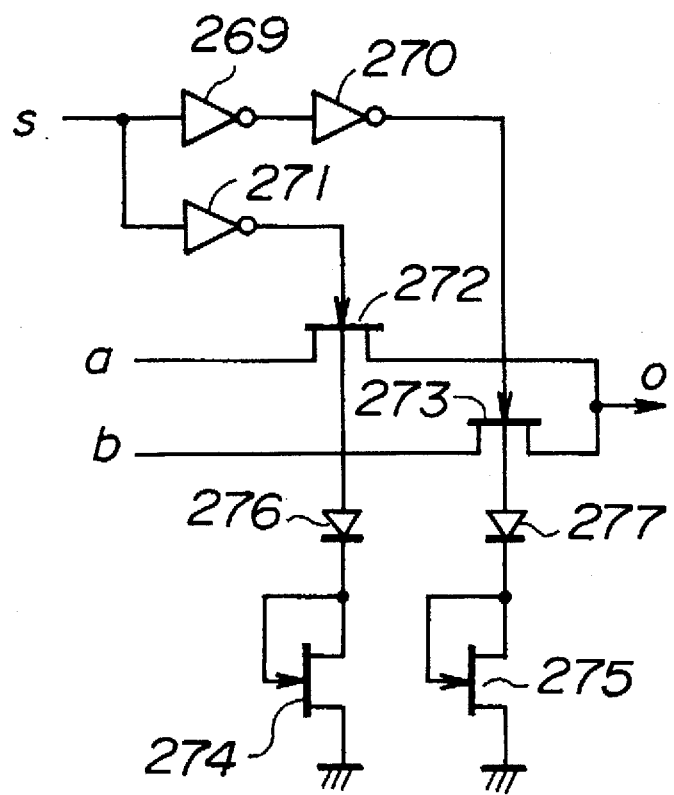
FIG. 17 is a circuit diagram illustrating a structure of each switching circuit in the prescaler shown in FIG. 15.

A description will now be given, with reference to FIGS. 15, 16 and 17, of a second use example. The second use example relates to a prescaler in which the logic gate circuit (the inverter with the output driver) according to the second embodiment shown in FIG. 4 is used.

Figure 15:
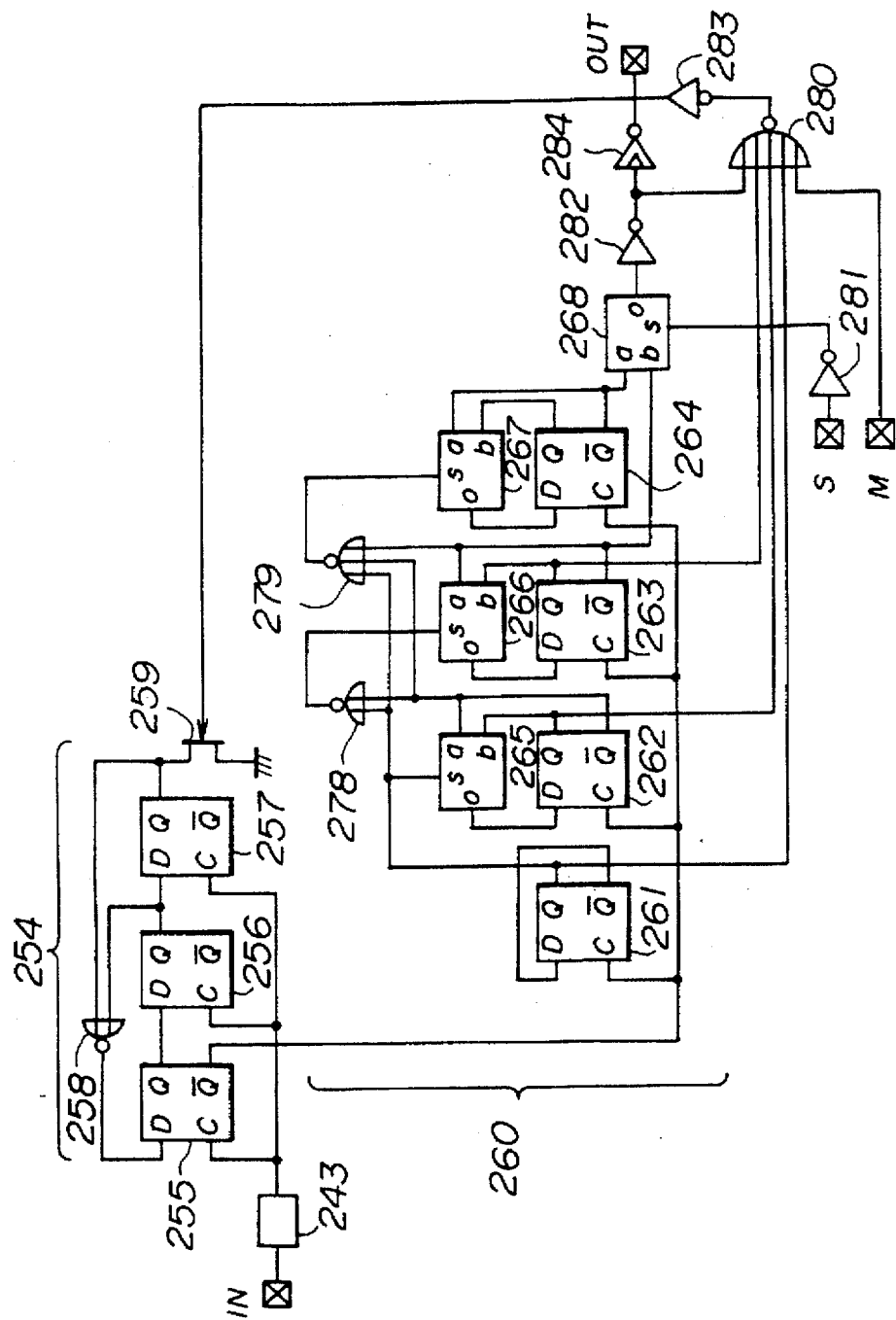
FIG. 15 is a circuit diagram illustrating a prescaler in which the logic gate circuit according to the present invention is used as an example.

Referring to FIG. 15, the prescaler has an input buffer 243 and dividers 254 and 260. The input buffer 243 is formed as shown in FIG. 16. Referring to FIG. 16, the input buffer 243 has a duty ratio control circuit 244, an inverter 250 used for wave forming and a logic gate 253 having the same structure as that in the second embodiment (the inverter with output driver) shown in FIG. 4. The duty ratio control circuit 244 controls a duty ratio and has a capacitor 245, enhancement-type MES FETs 246–248 and a depletion-type MES FET 249. The inverter 250 has a depletion-type MES FET 251 for a load and an enhancement-type MES FET 252 for a driver.

Returning to FIG. 15, the divider 254 is formed of D flip flops 255–257, a NOR gate and an enhancement-type MES FET 259 for varying the dividing ratio.

The divider 260 has D flip flops 261–264, switching circuits 265–268, NOR gates 278–280, inverters 281–283, and an inverter 284 with an output driver. Dividing ratio control signals S and M are respectively supplied to the inverter 281 and the NOR gate 280. Each of the switching circuits 265–268 is formed as shown in FIG. 17. Referring to FIG. 17, each of the switching circuits has inverters 269–271, enhancement-type MES FETs 272–275 and a Schottky diode 277.

A description will now be given, with reference to FIGS. 18 and 19, of a third use example. The third use example relates to a delay locked loop (DLL) circuit in which the logic gate circuit (the inverter with the output driver) according to the second embodiment shown in FIG. 4 is used.

Figure 18:
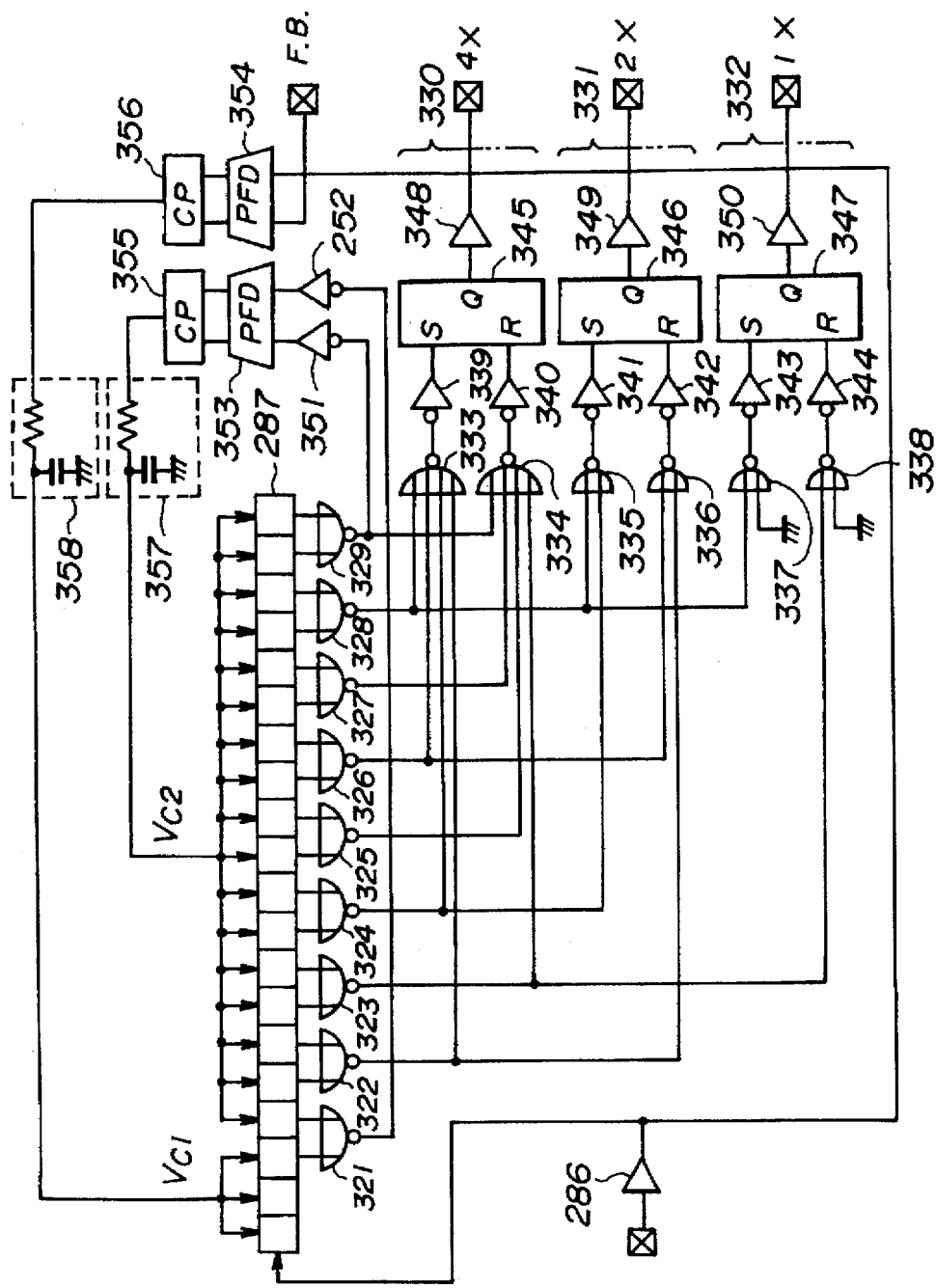
FIG. 18 is a circuit diagram illustrating a delay locked loop circuit in which the logic gate according to the present invention is used as an example.
Figure 19:
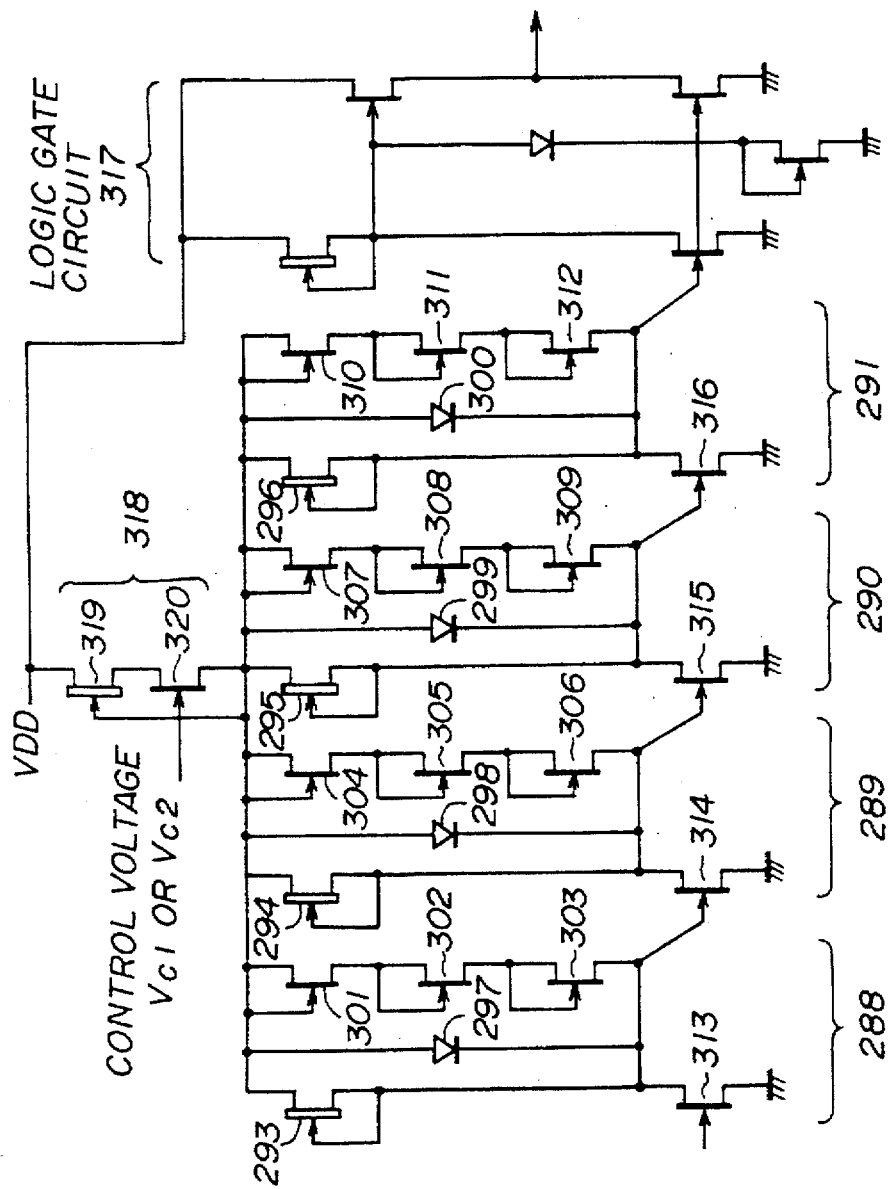
FIG. 19 is a circuit diagram illustrating a first stage of a delay circuit in the delay locked loop circuit shown in FIG. 18.

Referring to FIG. 18, the DLL circuit has a TTL input buffer, a delay circuit 287 having a plurality of stages, NOR gates 321–329 used for detecting signal edges, inverters 339–344, RS flip flops 345–347, buffers 348–350, inverters 351 and 352, phase comparing circuits 353 and 354, charge pump circuits 355 and 356 and low pass filters 357 and 358. Control voltages Vc1 and Vc2 are supplied to the delay circuit 287, and each stage of the delay circuit 287 is formed as shown in FIG. 19. Referring to FIG. 19, each stage of the delay circuit 287 has inverters 288–291, a logic gate circuit 317 having the same structure as that according to the second embodiment shown in FIG. 4 and a power supply control circuit 318. The inverters 288–291 are formed of depletion-type MES FETs 293–296 each of which is used as a load, Schottky diodes 297–300 each of which is used as a load, enhancement-type MES FETs 301–312 each of which has a diode connection form and is used as a load and enhancement-type MES FETs 313–316 each of which is used as a driver. The power supply control circuit 318 is formed of a depletion-type MES FET 319 and an enhancement-type MES FET 320.

A description will now be given, with reference to FIGS. 20, 21, 22, 23 and 24, of a fourth use example. The fourth use example relates to an analog-to-digital (AD) converter in which the present invention is used.

Figure 20:
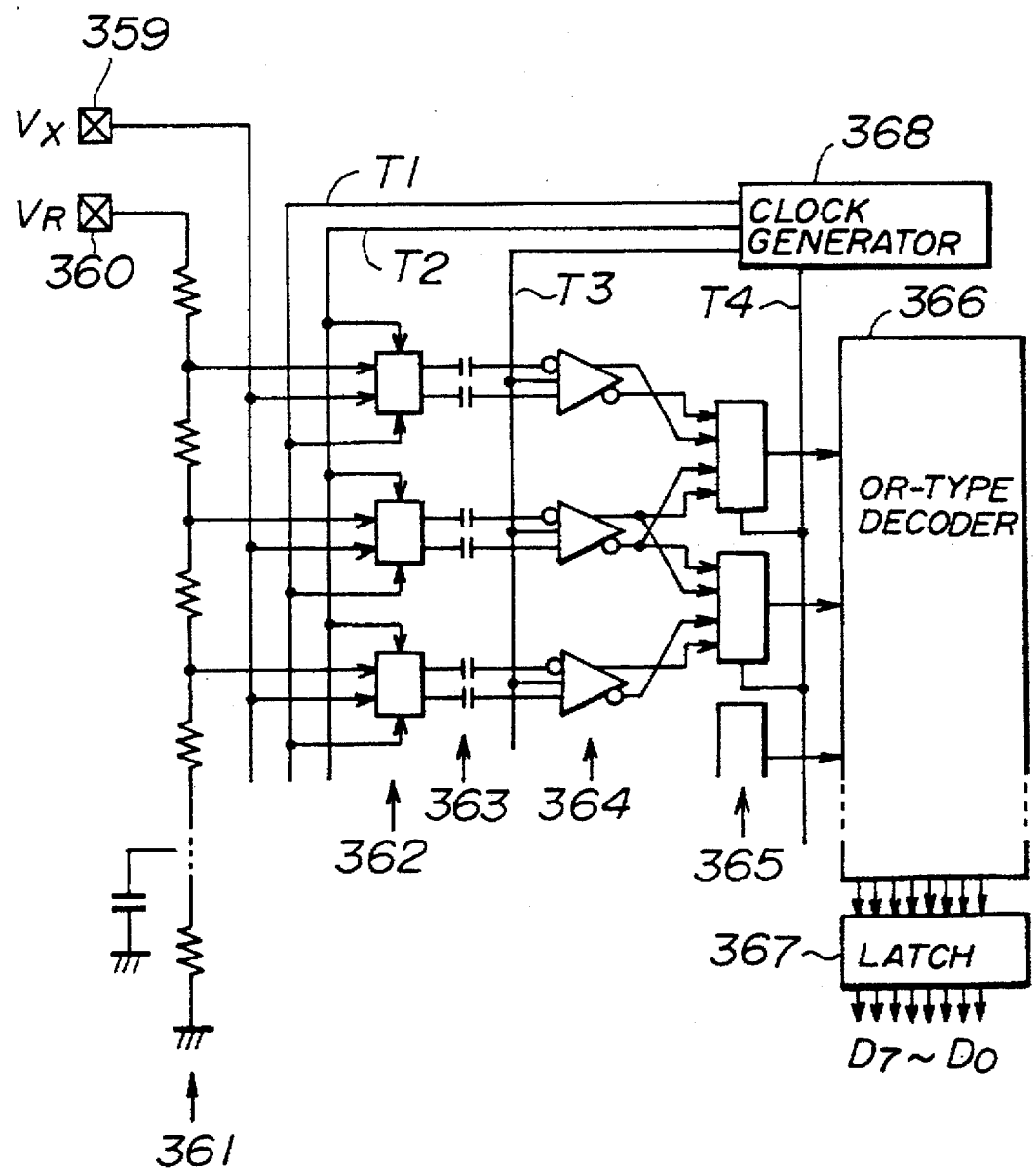
FIG. 20 is a circuit diagram illustrating an analog-to-digital converter in which the logic gate circuit according to the present invention is used as an example.

Referring to FIG. 20, the AD converter has an analog voltage input terminal 359, a reference voltage input terminal 360, a voltage divider circuit 361, a switching circuit array 362, a capacitor array 363, a comparing circuit array 364, a latch circuit array 365, an OR-type decoder 366, a latch circuit 367 having digital outputs D7–D0 and a timing signal generating circuit 368. An analog voltage $V_x$ and a reference voltage $V_R$ are respectively input to the analog voltage input terminal 359 and the reference voltage input terminal 360. The switching circuit array 362 is used to get the analog voltage $V_x$ and divided reference voltages obtained by the voltage divider circuit 363. Comparison results obtained by the comparing circuit array 364 are latched by the latch circuit array 365. The OR-type decoder 366 decodes the comparison results latched by the latch circuit array 365. The output of the OR-type decoder 366 is latched by the latch circuit 367. The timing signal generating circuit 368 generates timing signals T1, T2, T3 and T4. The timing signals T1 and T2 are supplied to respective switching circuits of the switching circuit array 362. The timing signal T3 is supplied to respective comparing circuits of the comparing circuit array 364. The timing signal T4 is supplied to respective latch circuits of the latch circuit array 365. The timing signal generating circuit 368 is formed as shown in FIG. 21.

Figure 21:
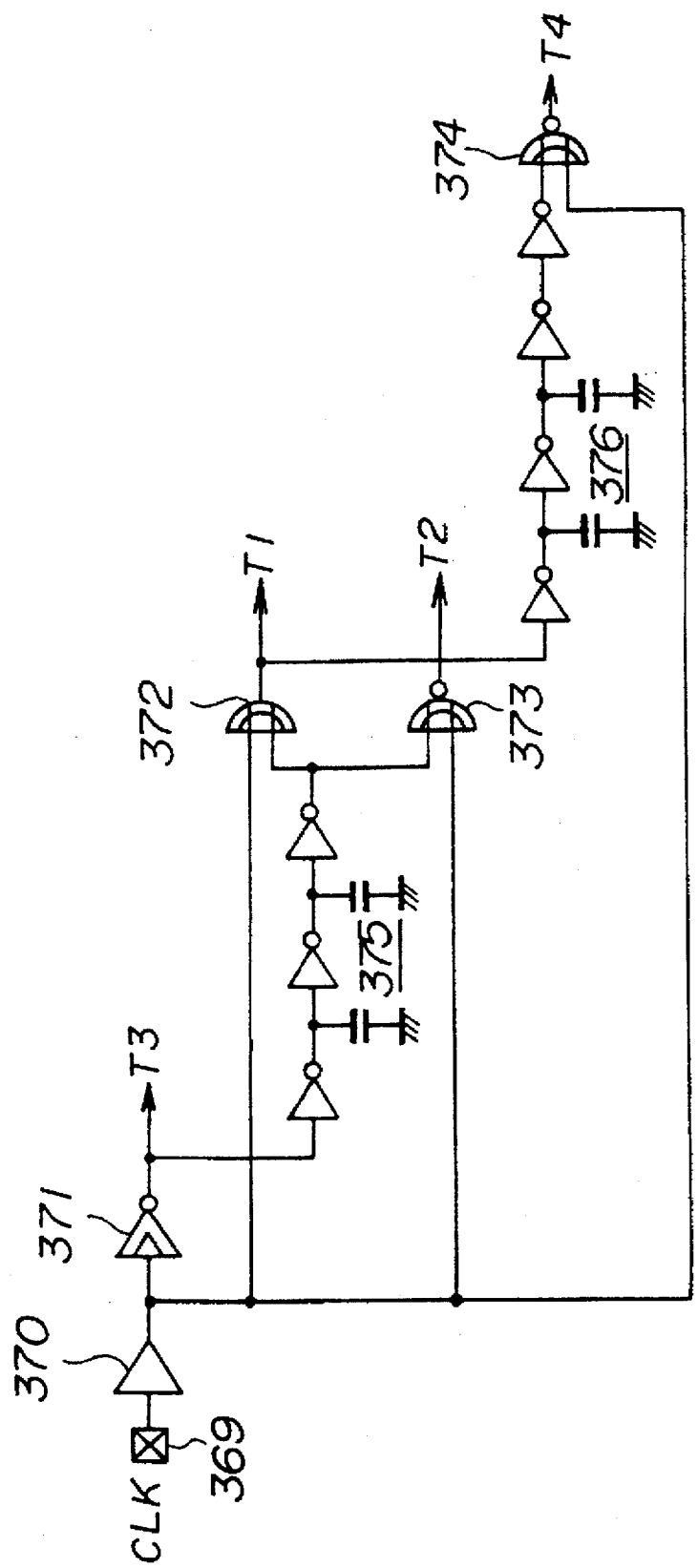
FIG. 21 is a circuit diagram illustrating a structure of a timing signal generating circuit in the analog-to-digital converter shown in FIG. 20.
Figure 22:
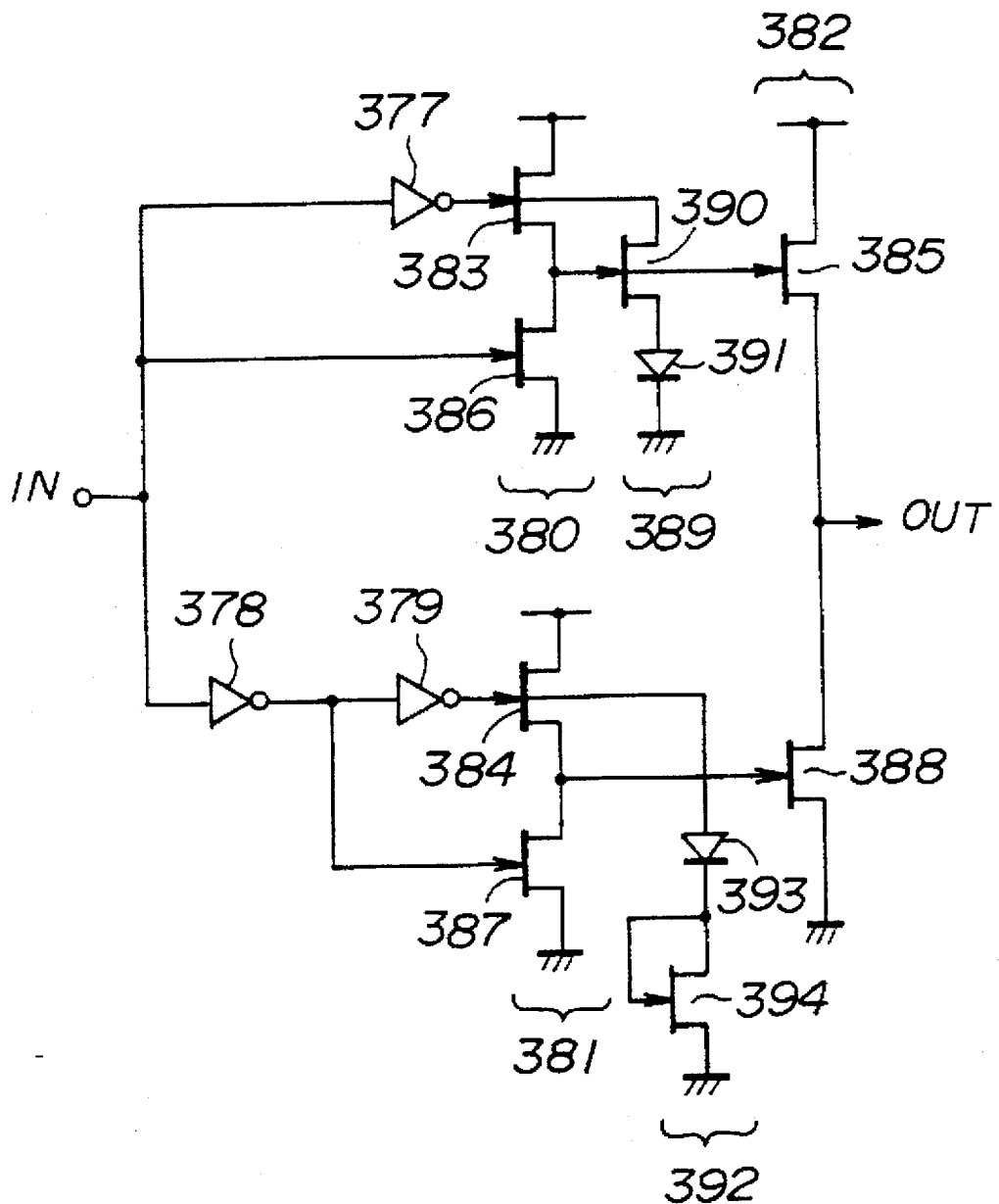
FIG. 22 is a circuit diagram illustrating a structure of an inverter used in the timing signal generating circuit shown in FIG. 21.

Referring to FIG. 21, the timing signal generating circuit 368 has an input terminal 369 to which a clock signal CLK is input, a TTL buffer 370, an inverter 371 with an output driver, an OR gate 372 with an output driver, NOR gates 373 and 374 each of which has an output driver and delay circuits 375 an 376. The inverter 371 with the output driver is formed as shown in FIG. 22. Referring to FIG. 22, the inverter 371 has inverters 377–379, push-pull circuits 380–382 and clamping circuits 389 and 392. The push-pull circuits 380–382 have enhancement-type MES FETs 383–385 for the pull-up and enhancement-type MES FETs 386–388 for the pull-down. The clamping circuit 389 clamps the output of the push-pull circuit 380 at an appropriate level when the push-pull circuit 380 outputs the H-level, and is formed of an enhancement-type MES FET 390 and a Schottky diode 391. The clamping circuit 392 clamps the gate voltage of the MES FET 384 so that the output of the push-pull circuit 381 has an appropriate level when the push-pull circuit 381 outputs the H-level. The clamping circuit 392 has a Schottky diode 393 and an enhancement-type MES FET 394.

Figure 23:
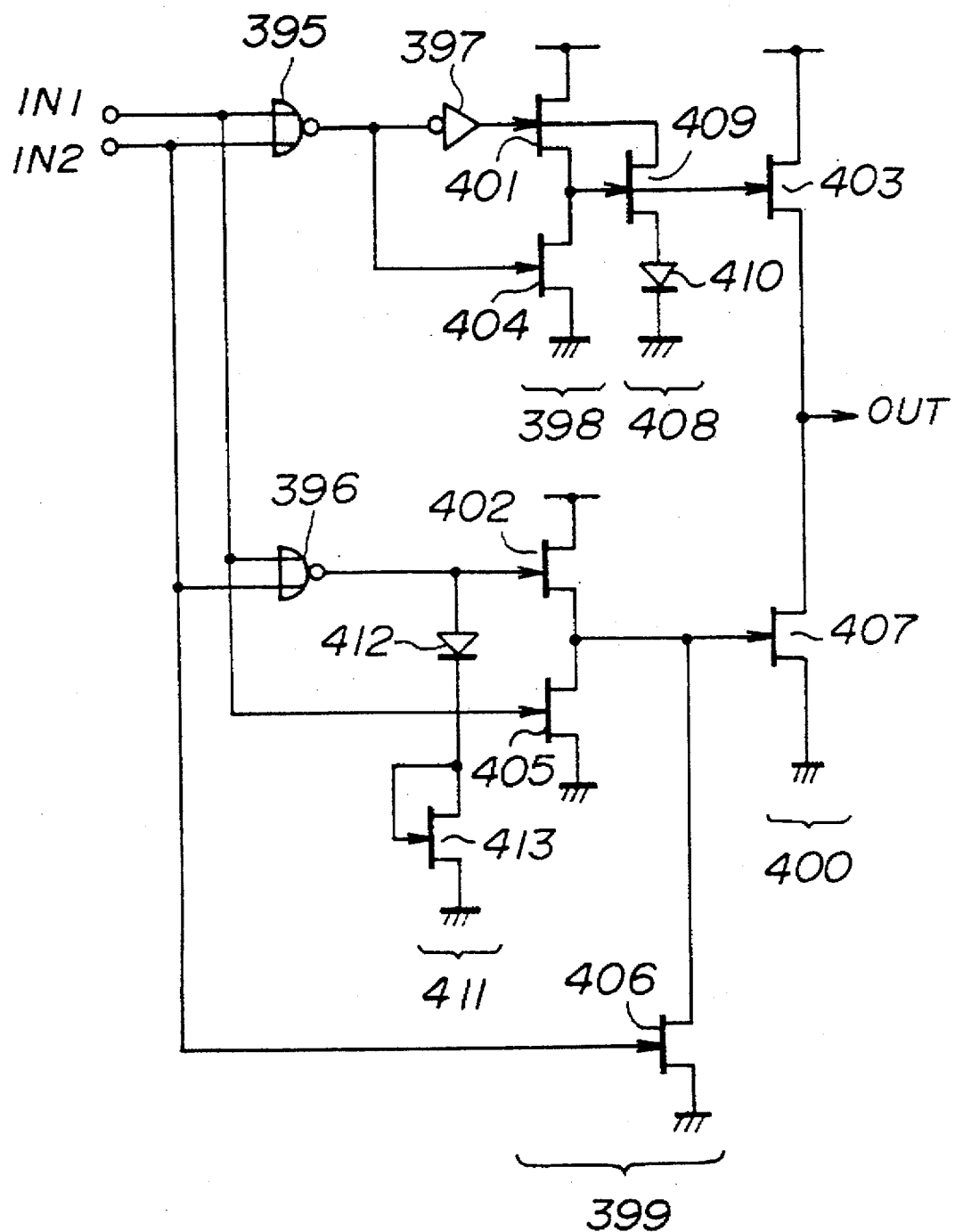
FIG. 23 is a circuit diagram illustrating a structure of an OR gate used in the timing signal generating circuit shown in FIG. 21.

The OR gate 372 with the output driver is formed as shown in FIG. 23. Referring to FIG. 23, the OR gate 372 has NOR gates 395 and 396, an inverter 397, push-pull circuits 398–400 and clamping circuits 408 and 411. The push-pull circuits 398–400 are formed of enhancement-type MES FETs 401–403 for the pull-up and enhancement-type MES FETs 404–407 for the pull-down. The clamping circuit 408 clamps the gate voltage of the MES FET 401 so that the output of the push-pull circuit 398 has an appropriate level when the push-pull circuit 398 outputs the H-level. The clamping circuit 408 is formed of an enhancement-type MES FET 409 and the Schottky diode 410. The clamping circuit 411 clamps the gate voltage of the MES FET 402 so that the output of the push-pull circuit 399 has an appropriate level when the push-pull circuit 399 outputs the H-level. The clamping circuit 411 is formed of a Schottky diode 412 and an enhancement-type MES FET 413.

Figure 24:
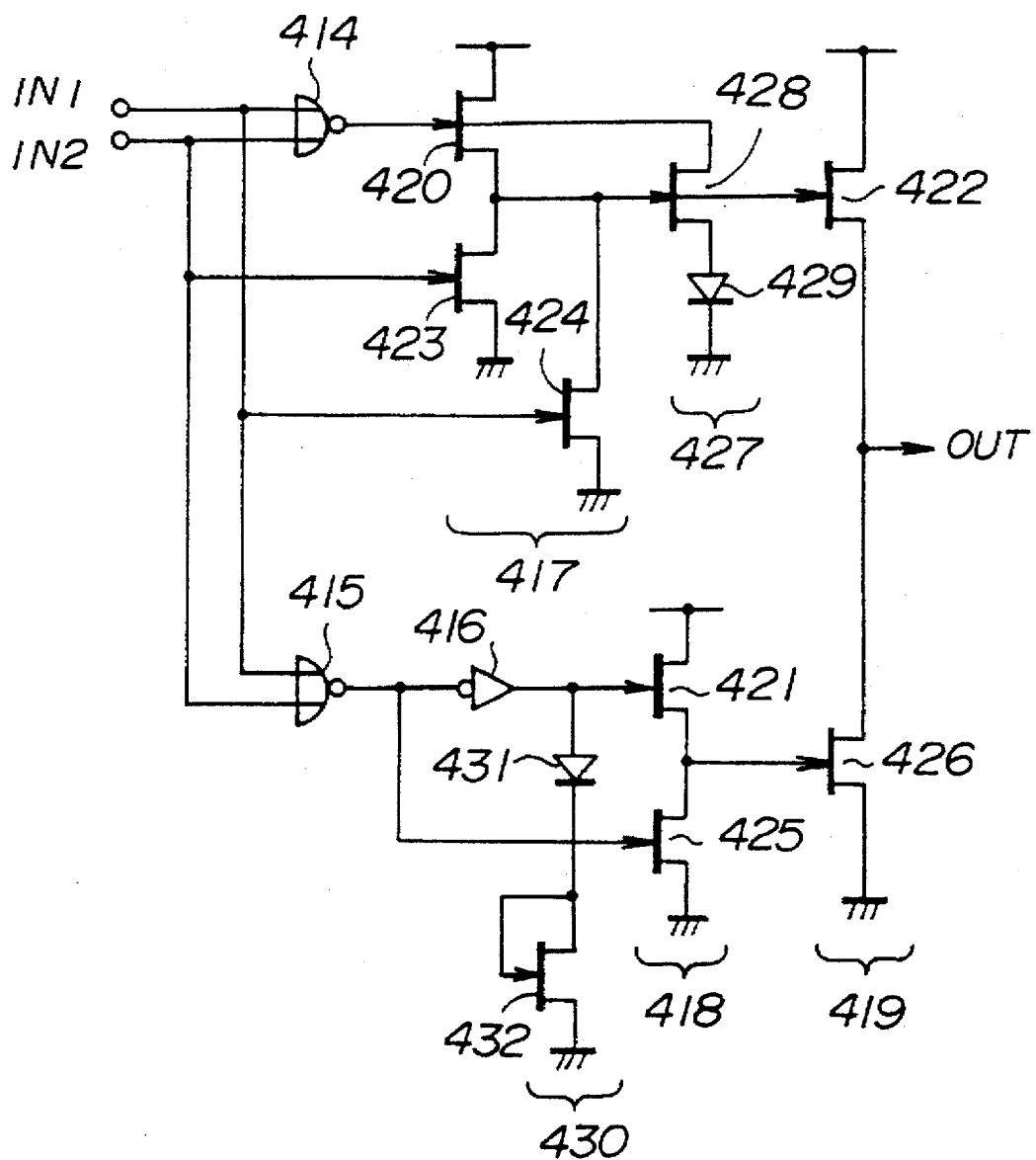
FIG. 24 is a circuit diagram illustrating a structure of each NOR gate used in the timing signal generating circuit shown in FIG. 21.

Each of the NOR gates 373 and 374 each of which has an output driver is formed as shown in FIG. 24. Referring to FIG. 24, each of the NOR gates 373 and 374 has NOR gates 414 and 415, an inverter 416, push-pull circuits 417–419 and clamping circuits 427 and 430. The push-pull circuit 417 is formed of an enhancement-type MES FET 420 for the pull-up and enhancement-type MES FETs 423 and 424 for the pull-down. The push-pull circuits 418 and 419 are formed of enhancement-type MES FETs 421 and 422 for the pull-up and the enhancement-type MES FETs 425 and 426 for the pull-down. The clamping circuit 427 clamps the output of the push-pull circuit 424 at an appropriate level when the push-pull circuit 424 outputs the H-level, and is formed of an enhancement MES FET 428 and a Schottky diode 429. The clamping circuit 430 clamps the gate voltage of the MES FET 421 so that the output of the push-pull circuit 418 has an appropriate level when the push-pull circuit 418 outputs the H-level. The clamping circuit 430 is formed of a Schottky diode 431 and an enhancement-type MES FET 432.

A description will now be given, with reference to FIGS. 25, 26, 27, 28 and 29, of a fifth use example. The fifth use example relates to a DC-to-DC converter in which the present invention is used.

Figure 25:
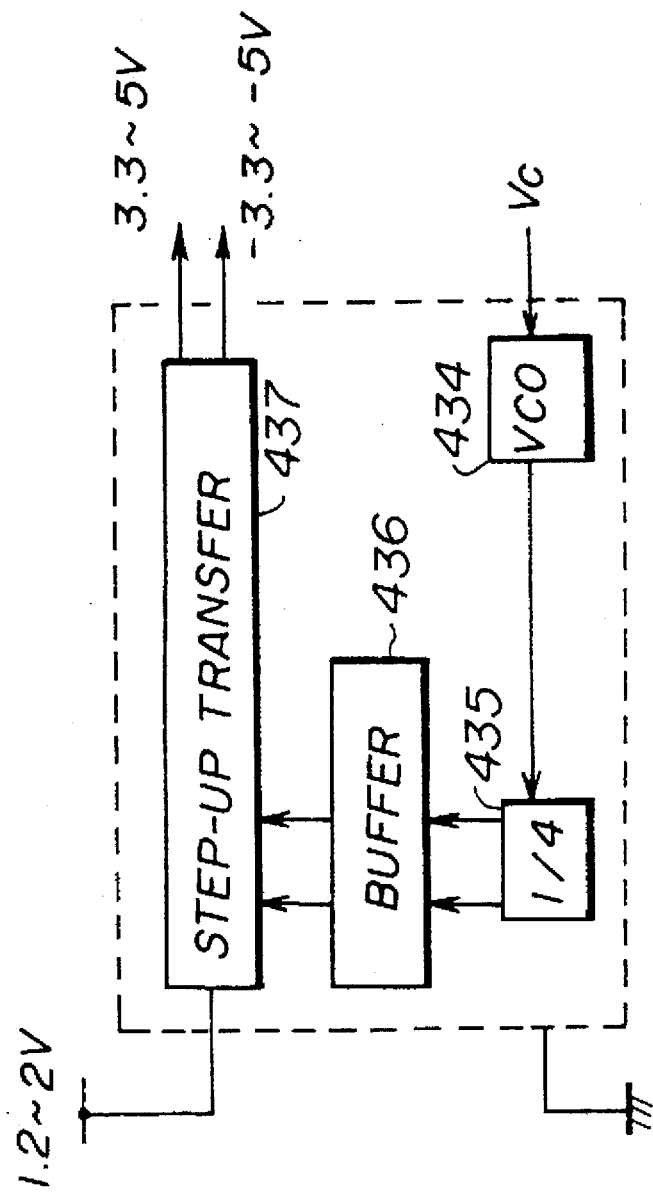
FIG. 25 is a circuit diagram illustrating a DC-DC converter in which the logic gate circuit according to the present invention is used as an example.

Referring to FIG. 25, the DC-to-DC converter has a voltage-controlled oscillator (VCO) 434, a dividing circuit 435, a buffer circuit 436 and a step-up transfer circuit 437. The dividing circuit 435 outputs two divided signals having an inversion relationship with each other, each of the two divided signals having a frequency which is one fourth as large as a frequency of the output of the voltage-controlled oscillator 434. The buffer circuit 436 amplifies the divided signal output from the dividing circuit 435. The step-up transfer circuit 437 steps up the output of the buffer circuit 436.

Figure 26:
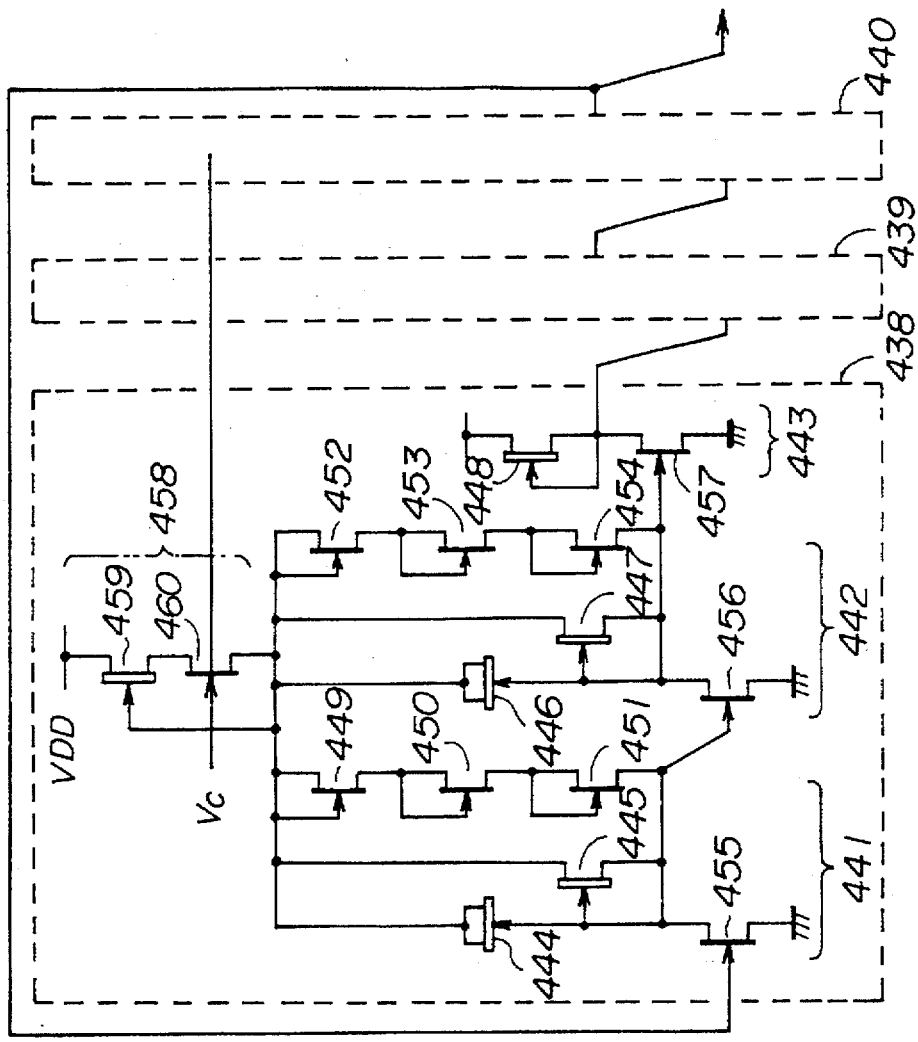
FIG. 26 is a circuit diagram illustrating a structure of a voltage control oscillator in the DC-DC converter shown in FIG. 25.

The voltage-controlled oscillator 434 is formed as shown in FIG. 26. Referring to FIG. 26, the voltage-controlled oscillator 434 has inverters 438–440 forming a ring oscillator. Each of the inverters 438–440 has the same structure. The inverter 438 is provided with inverters 441–443 and a power supply circuit 458. The inverters 441–443 have depletion-type MES FETs 444–448 for the load and enhancement-type MES FETs 449–454 for the load and enhancement-type MES FETs 455–457 for the driver. The power supply circuit 458 has a depletion-type MES FET 459 and an enhancement-type MES FET 460.

Figure 27:
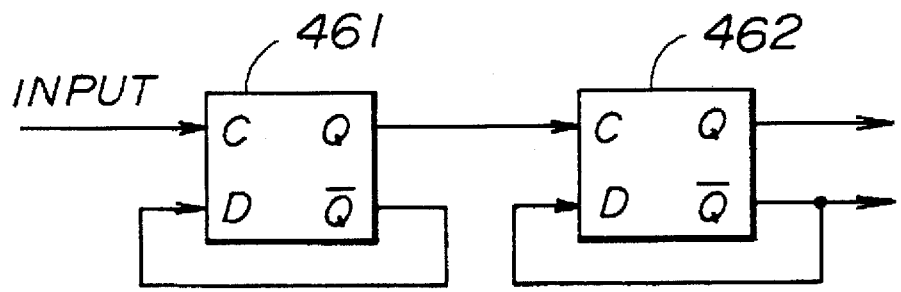
FIG. 27 is a circuit diagram illustrating a structure of a divider in the DC-DC converter shown in FIG. 25.

The dividing circuit 435 shown in FIG. 25 is formed as shown in FIG. 27. Referring to FIG. 27, the dividing circuit 435 has D flip flops 461 and 462 which are serially connected to each other.

Figure 28:
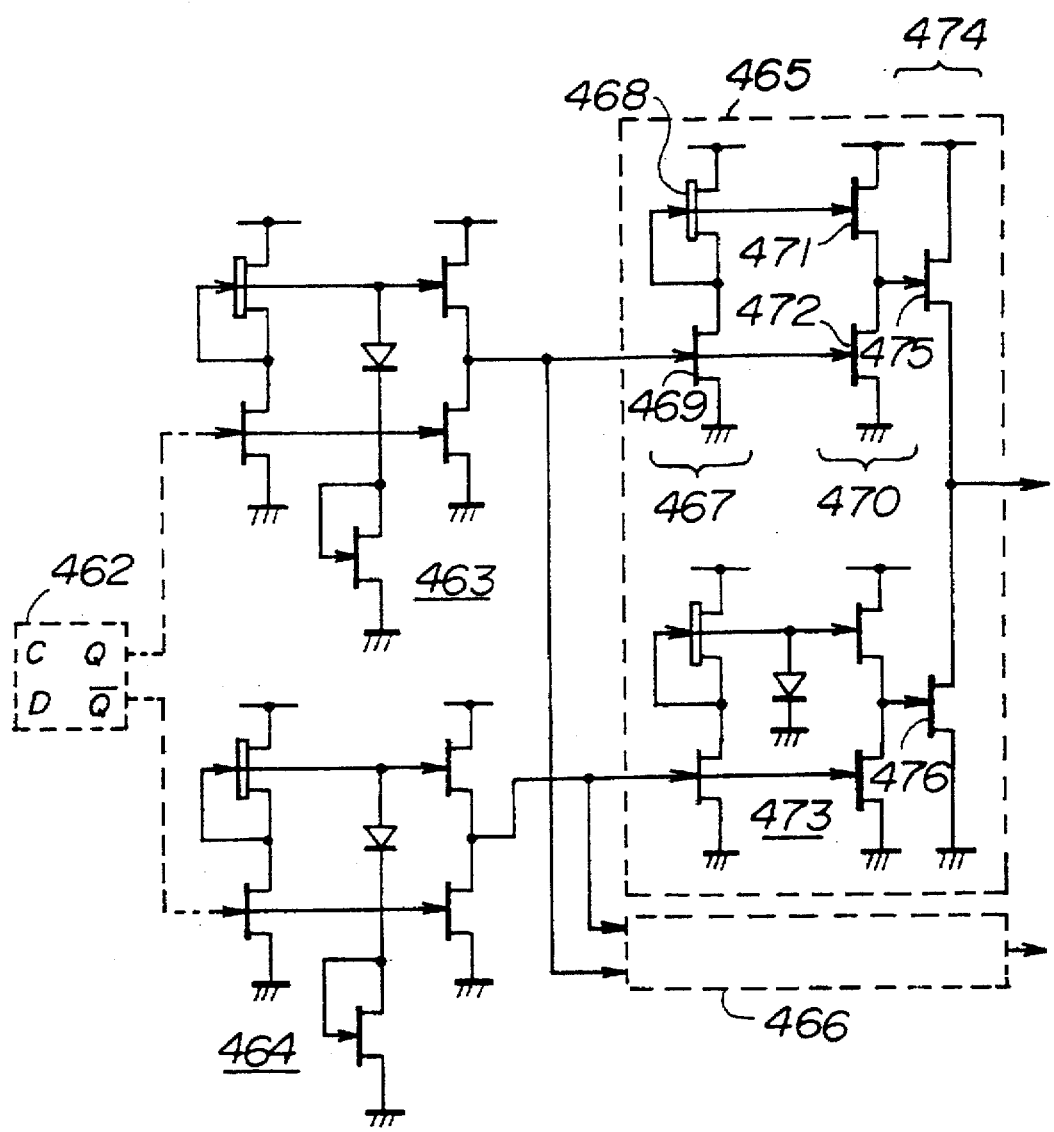
FIG. 28 is a circuit diagram illustrating a structure of a buffer circuit in the DC-DC converter shown in FIG. 25.

The buffer circuit 436 shown in FIG. 25 is formed as shown in FIG. 28. Referring to FIG. 28, the buffer circuit 436 has logic gate circuits 463 and 464 each of which has the same structure as that according to the second embodiment shown in FIG. 4 and buffers 465 and 466. The logic gate circuits 463 and 464 are connected to the D flip flop 462 of the dividing circuit 435. The buffers 465 and 466 have the same structure. The buffer 465 is formed of an inverter 467, a push-pull circuit 470, a logic gate circuit 473 having the same structure as that according to the first embodiment shown in FIG. 3 and a push-pull circuit 474. The inverter 467 is formed of a depletion-type MES FET 468 for a load and an MES FET 469 for a driver. The push-pull circuit 470 is formed of an enhancement-type MES FET 471 for the pull-up and an enhancement-type MES FET 472 for the pull-down. The push-pull circuit 474 is formed of an enhancement-type MES FET 475 for the pull-up and an enhancement-type MES FET 476 for the pull-down.

Figure 29:
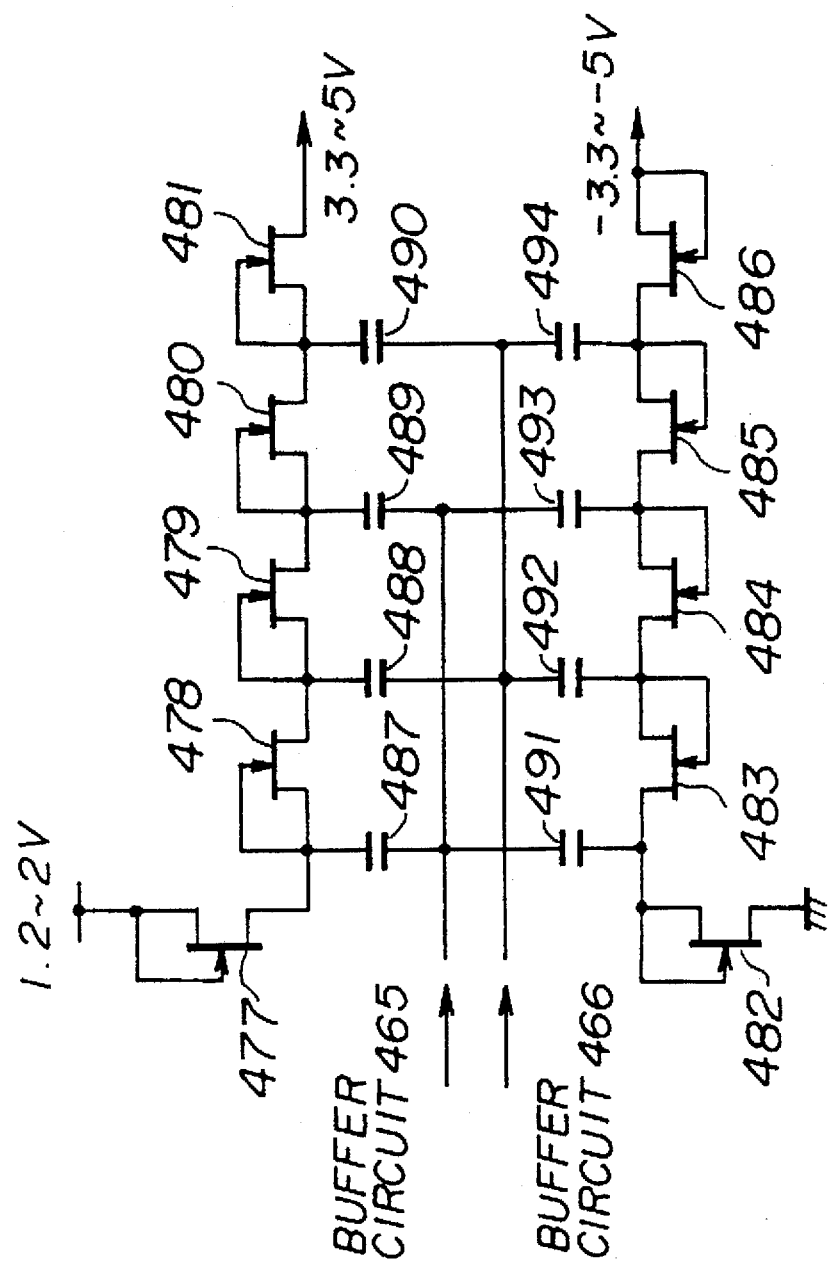
FIG. 29 is a circuit diagram illustrating a structure of a step-up transfer circuit in the DC-DC converter shown in FIG. 25.

The step-up transfer circuit 437 shown in FIG. 25 is formed as shown in FIG. 29. Referring to FIG. 29, the step-up transfer circuit 437 has enhancement-type MES FETs 477–486 and capacitors 487–494. The outputs of the buffers 465 and 466 of the buffer circuit 436 are supplied to the step-up transfer circuit 437.

The present invention is not limited to the aforementioned embodiments, and variations and modifications may be made within the scope of the claimed invention.

What is claimed is:

1. A logic gate circuit comprising:
a logic gate stage to which one or a plurality of input signals are supplied, for outputting a signal depending on a state of the one or the plurality of input signals, said logic gate stage including a first transistor and a second transistor which are serially connected to each other between a first line having a first voltage and a second line having a second voltage less then the first voltage, said first transistor being connected to the first line, said second transistor being connected to the second line and a gate electrode of said second transistor being provided with an input signal;

an output driver stage having a pull-up circuit formed of a pull-up enhancement-type transistor and a pull-down circuit, said pull-up enhancement-type transistor having a drain electrode connected to the first line, a gate electrode connected to a gate electrode of said first transistor and a source electrode connected to said pull-down circuit, said pull-down circuit being connected to the second line and controlled by the input signal supplied to said second transistor; and a clamping circuit for clamping a gate voltage of said pull-up enhancement-type transistor of said output driver stage at a limited voltage so that a node, at which the source electrode of said pull-up enhancement-type transistor and said pull-down circuit are connected, has a high level, said node being an output terminal of said logic gate circuit, said clamping circuit including an enhancement-type transistor and a Schottky diode having an anode connected to a source electrode of said enhancement-type transistor and a cathode connected to said second line, said enhancement-type transistor having a drain electrode connected to a node at which the gate electrode of said first transistor and the gate electrode of said pull-up enhancement-type transistor for the pull-up of said output driver stage are connected and a gate electrode connected to a node at which the source electrode of said pull-up enhancement-type transistor for the pull-up of said output driver stage and said pull-down circuit are connected, a threshold voltage of said enhancement-type transistor of said clamping circuit being approximately 0 volts.

2. The logic gate circuit as claimed in claim 1, wherein said enhancement-type transistor of said output driver stage is a compound semiconductor transistor.

3. The logic gate circuit as claimed in claim 1, wherein said first transistor is a depletion-type transistor used as a load and said second transistor is an enhancement type transistor used as a driver, said first transistor having a drain connected to the first line, and a gate and a source which are connected to each other, said second transistor being located between the source of said first transistor and the second line, the one or the plurality of input signals being input to the gate of said second transistor so that said second transistor is controlled in accordance with the state of the one or the plurality of input signals.

4. The logic gate circuit as claimed in claim 3, wherein said pull-up enhancement-type transistor of said output driver stage is a compound semiconductor transistor.

5. The logic gate circuit as claimed in claim 3, wherein said second transistor of said logic gate stage has a drain connected to the source of said first transistor, a source connected to said second line and a gate to which an input signal is supplied, and wherein said pull-down circuit of said output driver stage comprises a pull-down enhancement-type transistor having a drain connected to the source of said pull-up enhancement-type transistor for the pull-up, a source connected to said second line and a gate to which the input signal is supplied.

6. The logic gate circuit as claimed in claim 3, wherein said driver circuit of said logic gate stage comprises a plurality of enhancement-type transistors each of which has a drain connected to the source of said depletion-type transistor, a source connected to said second line and a gate to which one of a plurality of input signals is supplied, and wherein said pull-down circuit of said output driver stage comprises a plurality of enhancement-type transistors each of which has a drain connected to the source of said enhancement-type transistor for the pull-up, a source connected to said second line and a gate to which one of the plurality of input signals is supplied.

7. The logic gate circuit as claimed in claim 3, wherein said driver circuit of said logic gate stage comprises a plurality of enhancement-type transistors which are serially connected to each other between the source of said depletion-type transistor and said second line, each of said plurality of enhancement-type transistors having a gate to which one of a plurality of input signals is supplied, and wherein said pull-down circuit of said output driver stage comprises a plurality of enhancement-type transistors which are serially connected to each other between the source of said enhancement-type transistor for the pull-up and the second line, each of said plurality of enhancement-type transistors having a gate to which one of the plurality of input signals is supplied.

8. The logic gate circuit as claimed in claim 1, wherein said enhancement-type transistor of said clamping circuit is formed as a diode, a forward direction of said Schottky diode and said enhancement-type transistor formed as the diode being in a direction from said enhancement-type transistor for the pull-up to said second line.

9. A logic gate circuit comprising:

a logic gate stage to which one or a plurality of input signals are supplied, for outputting an output signal depending on a state of the one or the plurality of input signals, said logic gate stage including a pull-up transistor and a pull-down transistor which are serially connected to each other between a first line having a first voltage and a second line having a second voltage less than the first voltage, at least a gate electrode of said pull-up transistor being provided with an input signal, the output signal output from an output node at which said pull-up transistor and said pull-down transistor are connected;

an output driver stage having a pull-up circuit formed of an enhancement-type transistor and a pull-down circuit, said enhancement-type transistor having a drain electrode connected to the first line, a gate electrode to which the output node of said logic gate stage and a source electrode connected to said pull-down circuit, said pull-down circuit being connected to the second line a clamping circuit for clamping a gate voltage of said pull-up transistor of said logic gate stage at a limited voltage so that a voltage of the output node of said logic gate stage is clamped, said clamping circuit including a transistor and a diode having an anode connected to said transistor and a cathode connected to said second line, said transistor having a drain electrode connected to the gate electrode of said pull-up transistor of said logic gate stage and a gate electrode connected to the output node of said logic gate.

* * * * *